United States Patent [19]
Blades

[11] Patent Number: 5,729,145
[45] Date of Patent: Mar. 17, 1998

[54] METHOD AND APPARATUS FOR DETECTING ARCING IN AC POWER SYSTEMS BY MONITORING HIGH FREQUENCY NOISE

[75] Inventor: Frederick K. Blades, Boulder, Colo.

[73] Assignee: Siemens Energy & Automation, Inc., Alpharetta, Ga.

[21] Appl. No.: 433,717

[22] Filed: May 2, 1995

Related U.S. Application Data

[63] Continuation-in-part of Ser. No. 316,169, Sep. 6, 1994, Pat. No. 5,434,509, which is a continuation of Ser. No. 100,632, Aug. 30, 1993, abandoned, which is a continuation-in-part of Ser. No. 35,231, Mar. 22, 1993, abandoned, which is a continuation-in-part of Ser. No. 921,829, Jul. 30, 1992, Pat. No. 5,223,795.

[51] Int. Cl.⁶ .......... G01R 31/08; G01R 19/00
[52] U.S. Cl. .......... 324/536; 324/522; 324/613; 340/650
[58] Field of Search .......... 324/520, 521, 324/522, 525, 536, 613, 650; 361/111, 113; 340/650, 658

[56] References Cited

U.S. PATENT DOCUMENTS

| | | |
|---|---|---|
| H536 | 10/1988 | Strickland et al. . |
| Re. 30,678 | 7/1981 | Van Zeeland et al. . |
| 2,808,566 | 10/1957 | Douma . |
| 3,471,784 | 10/1969 | Arndt et al. . |
| 3,588,611 | 6/1971 | Lambden et al. . |
| 3,622,872 | 11/1971 | Boaz . |
| 3,746,930 | 7/1973 | Van Best et al. . |
| 3,775,675 | 11/1973 | Freeze et al. . |
| 3,855,443 | 12/1974 | Bell, Jr. et al. . |
| 3,869,665 | 3/1975 | Kenmochi et al. . |
| 3,878,460 | 4/1975 | Nimmersjo . |
| 3,911,323 | 10/1975 | Wilson et al. . |
| 3,914,667 | 10/1975 | Waldron . |
| 4,047,235 | 9/1977 | Davis . |
| 4,115,828 | 9/1978 | Rowe et al. . |
| 4,169,260 | 9/1979 | Bayer . |
| 4,214,210 | 7/1980 | O'Shea . |
| 4,245,187 | 1/1981 | Wagner et al. . |
| 4,316,187 | 2/1982 | Spencer . |
| 4,376,243 | 3/1983 | Renn et al. . |
| 4,387,336 | 6/1983 | Joy et al. . |
| 4,402,030 | 8/1983 | Moser et al. . |
| 4,466,071 | 8/1984 | Russell, Jr. . |
| 4,639,817 | 1/1987 | Cooper et al. . |
| 4,644,439 | 2/1987 | Taarning . |
| 4,658,322 | 4/1987 | Rivera . |
| 4,670,812 | 6/1987 | Doerfler et al. . |
| 4,697,218 | 9/1987 | Nicolas . |
| 4,771,355 | 9/1988 | Emery et al. . |
| 4,810,954 | 3/1989 | Fam . |
| 4,853,818 | 8/1989 | Emery et al. . |
| 4,858,054 | 8/1989 | Franklin . |
| 4,922,368 | 5/1990 | Johns . |
| 4,931,894 | 6/1990 | Legatti . |
| 4,949,214 | 8/1990 | Spencer . |
| 5,185,684 | 2/1993 | Beihoff et al. . |

(List continued on next page.)

OTHER PUBLICATIONS

"Detection of Arcing . . . " Electric Power Research Inst. EPRI EL-2757, Dec. 1982.

"Directional Coupler . . . " Alejandro Duenas J., RF Design, Feb. 1986, pp. 62-64.

"Directional Couplers" Antonio Paolantonio, RF Design, Sep./Oct. '79, 40-49.

*Primary Examiner*—Vinh P. Nguyen
*Assistant Examiner*—Glenn W. Brown

[57] ABSTRACT

Arcing in an AC power system is detected by monitoring the power waveform for wideband high-frequency noise, and examining the detected noise for patterns of variation in its amplitude synchronized to the power waveform. A narrowband, swept-frequency detector and synchronous averaging may be employed to improve discrimination of arc noise from background interference. An arcing fault interrupter for controlling a single circuit, and a whole house monitor, for detecting arcing anywhere in a house, are described.

51 Claims, 14 Drawing Sheets

U.S. PATENT DOCUMENTS

| | | |
|---|---|---|
| 5,185,685 | 2/1993 | Tennies et al. . |
| 5,185,686 | 2/1993 | Hansen et al. . |
| 5,185,687 | 2/1993 | Beihoff et al. . |
| 5,206,596 | 4/1993 | Beihoff et al. . |
| 5,208,542 | 5/1993 | Tennies et al. . |
| 5,223,795 | 6/1993 | Blades ................................. 324/536 |
| 5,224,006 | 6/1993 | MacKenzie et al. . |
| 5,280,404 | 1/1994 | Ragsdale . |
| 5,359,293 | 10/1994 | Boksiner et al. . |
| 5,432,455 | 7/1995 | Blades ................................. 324/536 |
| 5,434,509 | 7/1995 | Blades ................................. 324/536 |
| 5,578,931 | 11/1996 | Russell et al. ..................... 324/536 |
| 5,590,012 | 12/1996 | Dollar, II ......................... 324/536 X |
| 5,657,244 | 8/1997 | Seitz ................................. 324/536 X |

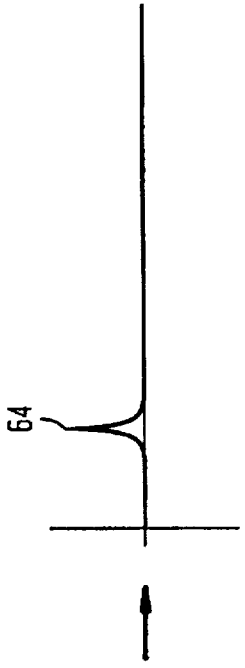
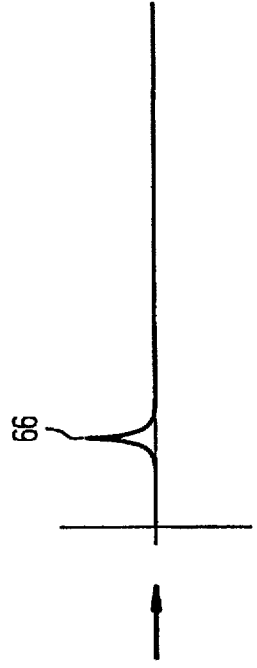
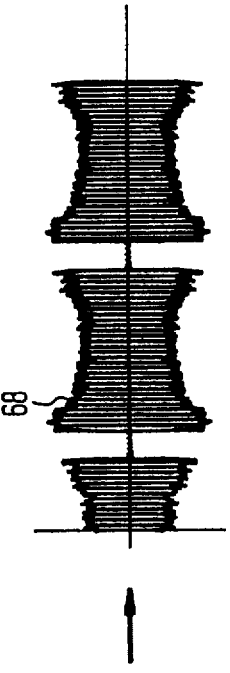
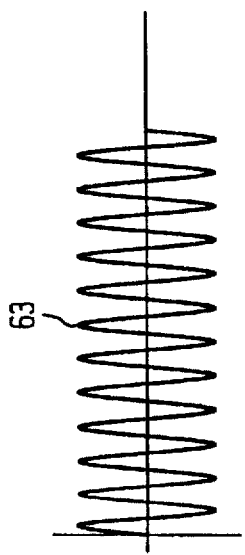
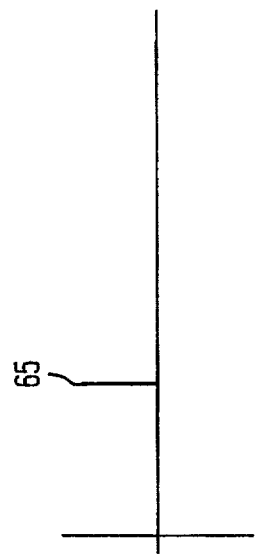
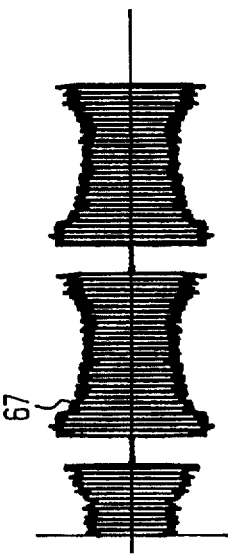

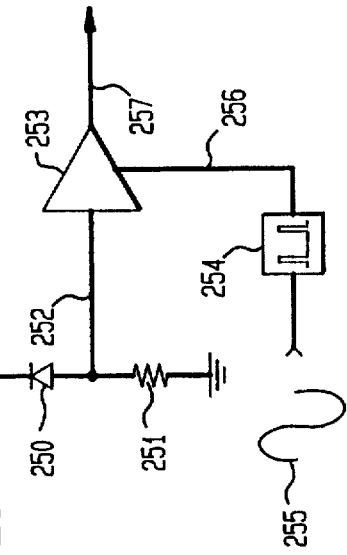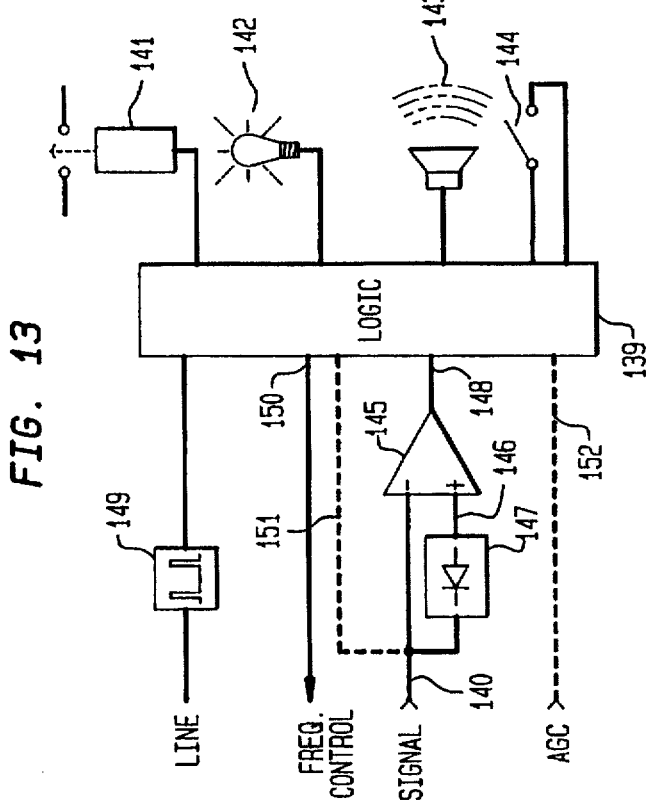

METHOD AND APPARATUS FOR DETECTING ARCING IN AC POWER SYSTEMS BY MONITORING HIGH FREQUENCY NOISE

CROSS-REFERENCE TO RELATED APPLICATIONS

This application is a continuation-in-part of Ser. No. 08/316,169, filed Sep. 6, 1994, U.S. Pat. No. 5,434,509, which is a continuation application of Ser. No. 08/100,632, filed Aug. 30, 1993, now abandoned, which is a continuation-in-part of Ser. No. 08/035,231, filed Mar. 22, 1993 and now abandoned, which is a continuation-in-part of Ser. No. 07/921,829, filed Jul. 30, 1992, now U.S. Pat. No. 5,223,795, issued Jun. 29, 1993.

BACKGROUND OF THE INVENTION

1. Field of the Invention

This invention relates to an inexpensive detector of electrical arcs on power lines, for providing advance warning of potentially dangerous conditions.

2. Discussion of the Prior Art

Electrical arcs can develop temperatures well above the ignition level of most common flammable materials, and therefore pose a significant fire hazard. For example, worn power cords in the home may arc sufficiently to start a fire. Fortunately, low-voltage arcing is an inherently unstable phenomenon and does not usually persist long enough to start a fire. Under certain conditions, reflected in particular characteristics of the electrical disturbance produced, the likelihood of the arc persisting and starting a fire is much higher. It is one object of the present invention to provide a method and apparatus to detect such potentially dangerous arcs by monitoring electrical disturbances on the power lines.

Two types of dangerous arcing that are likely to occur in the home are momentary, high-energy arcs caused by high-current faults and persistent, low-current "contact" arcing. A high-current fault, caused by an inadvertent direct connection between line and neutral or line and ground, will generally: 1) draw current up to or beyond the rated capacity of the circuit; 2) arc explosively as the contacts are physically made and broken; 3) dim lights and other loads indicating an excessive load is being drawn; and 4) if the circuit is properly protected by a circuit breaker, trip the breaker, thereby interrupting the current to the arc. Because such "line faults" are short-lived, the temperature rise in the feed conductors is limited and the fire danger results primarily from the explosive expulsion of minute glowing globules of copper from the contact area which may ignite nearby flammable materials. Even if a fire begins, however, the high visibility of the fault and the likely presence of someone nearby (who provided the physical impetus to bring the conductors together) sharply mitigates the potential for an uncontrolled fire.

Contact arcing, on the other hand, is arcing that occurs at connections in series with a load. As such, the maximum current in the arc is limited to the load current and therefore may be substantially below the overcurrent or 'trip' rating of an associated circuit breaker. Contact arcing is a complex physical phenomenon that may be induced by loose connections, oxidized contacts, foreign non-conducting material interfering with the conduction path, differences in contact materials, contact shapes, and other factors. Under certain conditions, such arcing may become persistent and present a substantial fire hazard.

One example of a condition that may cause contact arcing is a well-used wall outlet wherein the spring pressure provided by the contacts has been reduced through age and use, so that insufficient pressure is applied to the inserted plug contacts to ensure low-resistance connection.

Contact arcing is also commonly caused by use of extension cords of insufficient current-carrying capacity. For example, the plug may be heated by resistance heating, gradually decomposing elastomeric insulating material around the contacts until the material partially flows into the contact area, preventing proper contact from being made. This process may become regenerative as the initial arcing produces more heat, carbonizing the insulation and producing a thin insulative layer on the contact surface.

A third cause of contact arcing often observed in aluminum wiring involves the oxidation of contacts. In this case a chemical process, principally oxidation, builds up a semi-conductive or non-conductive layer on the surface of the contacts. Preferably, when the contact material is susceptible to oxidation, the connection is made gas-tight to prevent oxygen from entering and promoting oxidation. However, if the connections become loose over time, oxidation begins and arcing can result.

Contact arcing is also common when the springs that snap switches on or off become worn, increasing the time to closure and reducing the force that hold the contacts together.

A fifth example of contact arcing that is found to readily occur in residences is at the center contact of conventional light bulbs. Simple in design, and subjected to high temperatures and repeated use, the center contact often becomes loose and oxidizes, thereby increasing the likelihood of arcing. When arcing occurs, the lamp contact, usually made of a low-melting-point solder, melts and reforms, either breaking the contact or establishing a new one. A common result in very old lamp fixtures is that arcing at the center contact or around the aluminum threads causes the lamp to become welded into the socket and therefore very difficult to remove.

Finally, high-resistance faults across the line are, in the present context, also considered contact arcing. Inadvertent "shorts" that exhibit enough resistance to prevent tripping of the circuit breaker may nonetheless produce arcing at the contact points, and are considered contact arcs. Frayed conductors that come into light or intermittent contact, or staples that inadvertently pierce wire insulation, can produce resistive shorts through contamination and oxide layers, particularly if moisture is present.

Most instances of contact arcing result from the gradual degeneration of current-carrying contacts. Dangerous arcs may begin as small and occasional arcing, gradually building up over time until the arcing becomes persistent enough to start a fire. Also, in sharp contrast to the visible nature of arcing produced by line faults, such as "hard" or "bolted" shorts, incipient contact arcing is often hidden from view, providing little or no indication of the impending danger. For this reason, it would be highly advantageous if contact arcing conditions could be detected early, and a warning provided before the danger due to the fault reaches a dangerous level.

It will thus be appreciated that there are fundamental differences between "hard shorts" and contact arcing. The former will generally involve high currents (>50A) and will be explosive at the fault point contact, so that the fault will either burn itself out or trip a circuit breaker. Conventional circuit protection devices are normally adequate to guard against line fault arcing. By comparison, the average current drawn in contact arcing is no more than the current drawn by the load itself. Nevertheless, even low-current contact arcing, for example, a 60 watt light bulb on the end of a faulty extension cord, or a set of Christmas tree lights with faulty contacts, may release sufficient heat to cause a fire. Accordingly, conventional circuit breakers are inadequate to prevent dangerous conditions due to contact arcing.

A need therefore exists for an inexpensive monitoring device capable of detecting arcing that may result in a fire and producing an alarm to alert the residents of the danger. One convenient device for domestic use would be a "Whole House" monitor capable of monitoring an entire house and providing a warning if potentially dangerous arcing occurs. To allow easy retrofit, such a device would monitor voltage alone; to monitor current would require a current sensor to be placed around a conductor, thereby requiring the device to be wired in place. Ideally, such arc detectors would be the electrical arc equivalent of the smoke detectors widely in use today, with the further advantage of warning of a potential fire days, weeks, or even months in advance of its occurrence.

As short arcs occur every time a switch is turned on or off, and as the duration of such arcing increases as switches and contacts age and wear out, it would be advantageous for a whole house monitor to sense all such arcing and display the relative "health" of the overall electrical system on a graduated scale, for example, by a green, yellow, and red "stoplight" indication. The green light would indicate that the duration of all arcs detected are within predetermined safe limits. The yellow light would indicate that arcing has exceeded safe limits, but is intermittent so as not to pose an immediate hazard. The red light, possibly together with an audible alarm, would serve to indicate that persistent arcing has occurred and poses an immediate danger of fire. In this case, the homeowner would be alerted to have an electrician check the wiring to determine the cause of the arcing.

A need also exists for a circuit breaker that, in addition to detecting arcing that may result in a fire, removes power from the load when hazardous arcing is present. Such a device could be conveniently packaged in much the same style as a conventional circuit breaker, or could be installed in an outlet similar to the currently available ground fault interrupters. Because the load current flows through the circuit breaker, it is convenient in this application to monitor load current.

The arc detector in each embodiment must be immune to noise commonly present on household power lines, e.g., due to lamp dimmers, brush motors, carrier-current communications systems, switching transients, broadcast radio signals, and the like.

While there have been a number of devices proposed to detect arcing, most address arcs caused by line faults. U.S. Pat. No. 5,121,282 issued to White, for example, describes a system that monitors both line voltage and current for characteristics particular to arcing and trips a circuit breaker if enough of these characteristics are present. The White device assumes, however, that the arc is the result of a line fault. One characteristic of a line fault is that the fault current will lag the voltage by 70°–90°. This is because under line fault conditions, the current flow will depend almost entirely on the power distribution wiring, which is generally highly inductive. A plug feeding a heater that is arcing in the socket - that is, exhibiting a contact fault—will not exhibit this characteristic, and thus the fault will not be detected by the White device.

U.S. Pat. No. 4,639,817 to Cooper et al shows an arc detector for "grid" or "spot" type power networks as used in large commercial or industrial installations. The Cooper circuit interrupts the power if high-frequency (10 KHz–100 KHz) noise of more than a threshold amplitude is detected for more than 0.7 seconds. If adapted to domestic use, this detector would be tripped by continuous high-frequency noise, such as from electric drills and the like.

U.S. Pat. No. 4,858,054 to Franklin recognizes that arc short circuits differ from dead short circuits, as described above, and indicates that different detection techniques should be employed. However, Franklin's device still monitors the current and trips only when current in excess of a predetermined level is detected. This level of current must be much higher than the circuit's rated current, to avoid tripping on motor start-up currents and the like. Accordingly, Franklin's device can only detect arcs in short circuits, and cannot detect a contact arc in series with a current-limiting load.

U.S. Pat. No. 5,206,596 to Beihoff et al recognizes that arcing produces random noise in the 100 KHz to 1 MHz range and discloses a specific transducer for simultaneously measuring the electric and magnetic fields radiated from the power line. Beihoff et al also discloses a method for determining if the noise is random by integrating the second derivative and comparing it to a threshold. Beihoff also recognizes that noise on the power line due to arcing is wideband, and teaches use of a comb filter for determining whether high-frequency noise on the power line is wideband. While the Beihoff device will detect arc noise, it can not discriminate between arc-induced noise and effectively random modulation, e.g., as provided by broadcast radio signals (as discussed below) or noise produced by non-dangerous arcing, e.g., brush contacts on electric motors, and therefore would not be suitable as an arc detector for household use.

Boksiner et al U.S. Pat. No. 5,047,724 is directed to an arc detector for use in the telephone system. Boksiner recognizes that the amplitude of arcing-induced high-frequency noise is inversely proportional to its frequency, and relies on this fact for arc detection. Boksiner requires a Fourier analysis to be carried out to detect arcing; this process cannot be implemented sufficiently inexpensively to provide an arc detector for domestic use. Moreover, Boksiner treats only arcing in a DC power system, as employed in the telephone system. Boksiner therefore does not consider the problem of discrimination of arcing-induced noise from other sources of noise on the AC power lines, as addressed by the present invention; more particularly, since the Boksiner disclosure is limited to DC systems, Boksiner fails to realize that noise due to arcing in an AC system exhibits patterns of variation in amplitude synchronized to the power waveform, nor of course that these patterns can be usefully detected in this discrimination.

U.S. Pat. No. 5,307,230 to MacKenzie discloses a circuit breaker intended to protect against "sputtering arc faults". As described by MacKenzie at column 1, lines 29–32, such faults occur between adjoining conductors; that is, MacKenzie's detector detects "soft" shorts completed by intermittent arcing, and does not purport to detect arcs in series with a load. The characteristics of such "sputtering arc faults" listed by MacKenzie include that "the resistance of the wiring may be high enough to limit the peak current and the ac current cyclically passes through zero to extinguish the arc so that the average current is low." Column 1, lines 35–38. MacKenzie's detector, therefore, is intended to respond to "low overcurrent but persistent faults such as sputtering or intermittent arc faults." Column 5, lines 8–9; see also column 5, line 67–column 6, line 3.

Insofar as understood, MacKenzie's detector compares di/dt, that is, the rate of change of the current, to a threshold value, in order to detect sudden changes in the current. Sudden changes due to arcing are distinguished from sudden changes due to switch closures or the like by requiring the sudden changes to occur repetitively. Such a detector would trip erroneously in response to the sudden changes in current provided by lamp dimmers, for example. MacKenzie thus monitors the current itself, rather than noise superimposed on the power lines, as does applicant's arc detector. In particular, MacKenzie's bare recognition that "the AC current cyclically passes through zero to extinguish the arc" does not suggest that monitoring the noise on the line for the presence of predetermined patterns of variation in its amplitude would be useful in detecting arcing.

Also of general interest are U.S. Pat. Nos. 5,038,246 to Durivage, 4,951,170 to Fromm, and 4,402,030 to Moser et al.

One device currently available is the Ground Fault Interrupter or GFI. Typical GFI devices are capable of detecting leakage currents to ground as low as several milliamps, and trip an associated circuit breaker in response. A GFI very effectively reduces not only the danger of fire due to shorts to ground but also protects humans that may be in the electrical path. A GFI device is not however capable of monitoring contact arcing as discussed herein.

OBJECTS OF THE INVENTION

It is therefore an object of the present invention to provide highly reliable methods and apparatus for monitoring line voltage, load current, or energy radiated from an AC power line, whereby arcing that may potentially cause a fire may be detected, while noise on the power line from other sources, such as electric motors, switch closures, lamp dimmers, broadcast radio signals, or communication systems is rejected.

It is a further object of the present invention to provide an inexpensive monitoring device that monitors the power waveform to detect patterns characteristic of arcing, in order to reliably detect dangerous arcing, and to warn the user with both visual and audible alarm indications.

It is yet a further object of the present invention to provide highly reliable, inexpensively manufacturable devices configurable to be capable of detecting potentially hazardous arcing on a particular circuit, and tripping a circuit breaker in response to such detection, interrupting current to that circuit, or for monitoring an entire power distribution system, e.g., of an entire residence, for the presence of dangerous arcing.

It is a further object of the invention to provide an arc detector that examines the power waveform in the frequency and time domains for detection of characteristics in both that are uniquely indicative of arcing, to provide a reliable arc detector.

SUMMARY OF THE INVENTION

The arc detector of the present invention monitors either the line voltage, the line current, or energy radiated from the power line for the presence of high-frequency noise exhibiting certain distinctive patterns in both the time and frequency domains which have been discovered by the inventor to be characteristic of arcing, and in this manner produces an output responsive to the presence of arcing. This output may be used to activate an alarm or to interrupt current to the arc.

Electrical arcing produced by alternating voltage will extinguish each time the voltage across the arc drops below a value sufficient to sustain the arc, and will re-ignite each time the voltage across the arc exceeds the arc's ignition voltage. Therefore, arcs sustained by an alternating power source will necessarily extinguish at least twice every full cycle of the power source frequency. The period of time when the arc is not conducting is hereinafter referred to as the 'gap'. It has been observed by the present inventor that when this gap is very large (i.e., gaps extending for 20°–90°, occurring twice during the 360° line cycle), the arc will be intermittent and highly unstable, often self-extinguishing after a short period of time. It has also been observed that as this gap becomes smaller (1°–20°), the arc becomes more persistent and under certain conditions may become self-sustaining. Once the arc becomes self-sustaining, it may persist for minutes or longer and is capable of generating significant amounts of heat.

During the time the arc is conducting current, it produces wideband, high-frequency noise ranging from about 10 KHz to perhaps 1 GHz. During the time the arc is not conducting current, i.e., during the gaps, it produces no noise. The present inventor has realized that the resulting characteristic pattern of high-frequency noise with synchronous gaps is unique to arcing and that therefore an algorithm for analyzing repetitive patterns in the amplitude of the noise can be used to detect arcing.

As stated, the noise produced by arcing is extremely wideband, extending in frequency as high as 1 GHz. While detection of arcing can be accomplished successfully in substantially any frequency band, there are two distinct advantages to monitoring in the 1–50 MHz range.

First, synchronous line noise from extraneous sources is minimal above 1 MHz; because noise present in this frequency range will interfere with radio broadcasts, household appliances and other equipment are intentionally designed to minimize such noise. For example, devices that provide remote control of appliances and the like by using carrier-current signals in the range of 100–300 KHz are tuned to produce almost no noise in the higher frequency range of the preferred embodiment of the invention disclosed herein. In fact, the most prevalent source of extraneous noise in the 1–10 MHz bandwidth is AM and communications-band broadcast radio transmission; such signals are reliably rejected according to the invention.

Second, monitoring in a higher frequency range minimizes the loading effects of other devices that might be present on the line and otherwise attenuate the arc noise signal. Power distribution wiring effectively behaves as transmission lines at high frequencies and as such provides a conduit for the noise signals. Other loads supplied by the distribution circuit are inductively isolated from the transmission line by their power cords and internal feed wires, which limits the amount of attenuation they can produce.

Noise originating from arcing and thus extracted will exhibit certain characteristics. First, the high-frequency noise will be present on both the line voltage and the load current whenever the arc is conducting. Second, the amplitude of the high-frequency noise will go essentially to zero as the arc extinguishes and re-ignites. This will occur each time the voltage across the arc goes through zero, i.e., every half-cycle of the line frequency, and therefore synchronous gaps in the high-frequency noise will be produced. If the load is resistive, the voltage across the arc will be in phase with the line voltage and consequently these gaps will coincide with the line voltage zero-crossings. If the load is reactive, the voltage across the arc (and therefore the gap) may be shifted in phase relative to the line voltage by up to plus or minus 90°. Therefore, depending on the reactance of the load in series with the arc, the gaps may or may not occur at the line voltage zero-crossings. In all cases when the arc is conducting, however, there will be gaps in this noise at intervals equal in time to ½ the line frequency cycle.

Contact arcing becomes dangerous only when the arcing persists long enough to transfer substantial heat to flammable materials in the immediate vicinity of the arc and thereby ignite a fire. The amount of time required for this to occur is a function of the power dissipated in the arc and the thermal resistance, heat capacity and proximity of surrounding flammable materials. Therefore, in order to detect contact arcing that may be dangerous, it is desirable, once the high-frequency noise is identified as being characteristic of arcing, to require that the arcing substantially persist for a period of time, typically several hundred milliseconds or more, before concluding that hazardous arcing exists.

One further consideration is that if the load is half-wave rectified, the load current will flow only on like-polarity half-cycles of the line voltage and consequently the arc will conduct only during these same half-cycles. In this case, the characteristic pattern of high-frequency noise followed by a gap will be exhibited only during alternate half-cycles of the line voltage; that is, the "gap" will include an entire half-cycle of the power waveform.

Accordingly, a useful arc detection device can monitor the line voltage, line current, or energy radiated from the power line, to determine whether wideband high-frequency noise exhibiting synchronous gaps is present. The term "synchronous gaps" in the context of this invention means that the time between gaps is an integral multiple of T/2, where T is the period of the line voltage. If continuous monitoring reveals that the noise is wideband and that the gaps occur in a manner indicative of the presence of arcing, e.g., if synchronous gaps are detected in a given fraction of the half-cycles of the power frequency over a time interval of predetermined length, potentially dangerous arcing is determined to exist. An appropriate control action may then be taken.

One embodiment of the present invention uses purely analog circuits (i.e., no microprocessor is required) to detect contact arcing on a single circuit. A second embodiment uses real-time software and a low-cost microprocessor to detect arcing anywhere in a residence; additional signal processing in this embodiment can be used to provide better discrimination in the presence of the high levels of background noise typical when monitoring an entire house. Other implementations carrying out the analytical techniques of the invention can be used, for example, to reduce the cost of the unit, and are within the scope of the invention. Other purely analog circuits might be employed for the lowest product cost. Alternatively, a digital signal processing (DSP) integrated circuit using conventional cross-correlation or autocorrelation analysis might be employed, at higher product cost, to detect arcing in more stringent applications.

Regardless of the signal processing technique chosen, the basic steps of the arc detection method of the invention are to determine, first, whether a broadband noise signal is present on the power line, and second, whether certain predetermined patterns of variations in the amplitude of the noise characteristic of arcing occur synchronized to the power waveform. That is, the power waveform is examined in both the frequency and time domains for characteristics indicative of arcing. Optionally, a detector may determine whether these patterns persist long enough to indicate dangerous arcing.

The present application is the third continuation-in-part of "parent patent" U.S. Pat. No. 5,223,095, and continues to disclose and claim methods and apparatus for detecting electrical arcing by monitoring the high-frequency noise on the line generated by arcs. The parent patent presents the basic understanding that persistent arcing generates wideband noise on the power line exhibiting gaps synchronous with the applied alternating line voltage, and that by monitoring for these characteristics, arcing can be detected and discriminated from other sources of noise.

The first continuation-in-part, Ser. No. 08/035,231 (abandoned), being the result of continued research by the inventor, discussed a number of improvements on both the detection hardware and the pattern detection algorithms.

The second continuation-in-part, Ser. No. 08/100,632 (abandoned in favor of continuation application Ser. No. 08/316,169 now U.S. Pat. No. 5,434,509), addresses circumstances where it would be desirable to detect even highly intermittent arcing or individual instances of arcing, such as in explosive environments, where it is desirable to have the detector interrupt power to the arc in the shortest time possible. Accordingly, Ser. No. 08/100,632 abandoned discloses improvements in the arc detection methods and means to allow detection of partial or fragmented arcing patterns.

These predecessor applications, and the parent patent, are all incorporated herein by this reference.

Further research and field testing has resulted in a significantly broader understanding of the characteristics of the noise produced by electrical arcing. The present application discloses correspondingly more reliable means and methods for detecting arcing, as well as certain particularly useful embodiments of devices therefor.

The parent patent recognized that the noise produced by arcing is wideband and that this property can be used to distinguish arcing from extraneous signals before applying pattern recognition techniques to detect the presence of gaps synchronous to the line frequency. For example, one method described therein first compares the noise signal to a threshold to produce a binary signal responsive to the variations in the amplitude of high-frequency noise around this threshold. If the pulse width produced is random, the signal is random and therefore wideband. The parent patent also describes the use of several non-overlapping bandpass filters, and determining that the noise signal is wideband if the output amplitude of each bandpass filter is substantially the same.

According to one aspect of the invention as disclosed in the present application, further improved methods and apparatus for testing the bandwidth of the noise signal by continuously sweeping a narrow bandwidth detector across the entire detection bandwidth are provided. In this manner, extraneous (non-arcing) signals with a narrow bandwidth, or signals of short time duration but wide bandwidth (due to a variety of non-dangerous sources discussed below) are attenuated, while broadband signals due to arcing pass substantially unaffected.

In the simplest embodiment, a relatively narrowband tuned filter is swept continuously across the detection bandwidth. This filter may be provided by a variable-frequency tuned transducer swept across the detection bandwidth by applying a varying voltage to a voltage-variable-capacitance tuning diode forming a tuned tank circuit together with a transducer coil. In another embodiment a more selective detector for use in the presence of high background signals is provided using conventional radio heterodyning techniques together with a swept-frequency local oscillator, to provide significantly narrower band detection.

The output of either of these swept-frequency detectors can be simply integrated and compared to the quiescent background level to determine if arcing exists. Such a device will not, however, be able to distinguish reliably between arcing and other sources of wideband noise, for example, spread-spectrum communication signals, or arcing noise that does not pose a danger of causing a fire, e.g., the arcs caused by brushes in motor commutators. As disclosed extensively in the three prior applications, the second characteristic feature of arc noise, i.e., the presence of gaps (or other regular patterns of amplitude variation) synchronous to the line frequency, can be additionally applied to distinguish dangerous arcing from other wideband signals. Accordingly, analysis of the power waveform in both the time and frequency domains is preferable in order to reliably differentiate arc-induced noise from noise due to other sources.

As described in the prior applications, the amplitude of the detected high-frequency signal can be compared to a threshold and the resulting binary output signal analyzed for the presence of patterns that exhibit synchronous gaps. These same methods can be applied to the swept-frequency detected signal described above to produce more reliable arc detection. However, during the development and testing of such systems, the present inventor realized several significant improvements that are disclosed in the present application.

One improvement recognizes that if the average background noise is low relative to the arc noise, improved detection performance can be achieved through the use of a non-linear, approximately logarithmic amplifier transfer response. A circuit is disclosed achieving this response, employing a fast automatic gain control ("AGC") circuit in an RF amplifier in the signal path, and using the AGC signal as the output signal.

Another improvement describes a method of time-domain analysis, called the "peak-integral" method, whereby a simple analog circuit can be made to reliably respond to the presence of synchronous gaps in the detected RF signal. Though less discriminating than other methods to be described, this approach makes possible very simple analog arc detectors well suited to single line monitoring.

A third improvement applies to applications wherein a high level of background signals, such as broadcast radio signals, may be present. To further reduce the effect of narrow bandwidth background signals, an additional "frequency deletion" method is disclosed whereby the swept-frequency detector is made to skip frequencies that are found to have strong background signals present, thereby reducing the background level and increasing the sensitivity of the detector.

A fourth improvement is referred to as "synchronous averaging". As discussed in detail in the predecessor applications, arcing is a random physical process that produces a broad spectrum of electrical noise. From the high-frequency random walk pattern of the charges traveling through the gas atmosphere between spaced contacts, to the low-frequency cycle-to-cycle variations observed in the amplitude of the noise and the width of the gaps due to minute physical variations at the contact surfaces, arcing exhibits a highly stochastic nature with many short-term discontinuities and variations. However, since a deterministic driving function, i.e., the sinusoidal power waveform, is always present, well-defined temporal modulation patterns, typically gaps, are apparent in the noise when viewed over many line cycles. According to the synchronous averaging technique disclosed herein, the line cycle is divided into a large number of equal time slots, and the noise level in each corresponding time slot is averaged. Random variations inherent in the arcing process are reduced, while variations in the amplitude of the noise synchronous to the line cycle, for example, gaps in arc-induced noise synchronized to the zero-crossings of the power waveform, are reinforced. With properly selected averaging constants, the result is a "clean" waveform that gradually rises to a shape uniquely characteristic of arcing over multiple cycles. Sporadic variations in the pattern of the noise due to the inherently random character of arcing are minimized, while features that are synchronous to the power waveform, typically the gaps, are readily recognizable. This final improvement, called "synchronous averaging" by the present inventor, may be combined with time and frequency domain analyses as disclosed in the predecessor applications and herein to yield a detection system that is responsive to arcing alone.

Finally, a circuit and method are described for implementing a self-test feature in the various arc detectors.

BRIEF DESCRIPTION OF THE DRAWINGS

The invention will be better understood if reference is made to the accompanying drawings, wherein:

FIGS. 7(a)–7(f) show the signals generated by a swept-frequency detector responsive to specular, impulse, and arc noise, respectively, all as functions of time, together with examples of these types of noise;

FIG. 13 shows a block diagram of an embodiment of an arc detector according to the invention, this embodiment employing the "threshold" method of arc detection;

FIG. 14 shows a block diagram of a further embodiment of an arc detector according to the invention, employing the "peak-integral" method of arc detection;

FIG. 20 shows a block diagram of an arc noise simulator for use in implementing a self-test feature.

DESCRIPTION OF THE PREFERRED EMBODIMENTS

Figure 1:
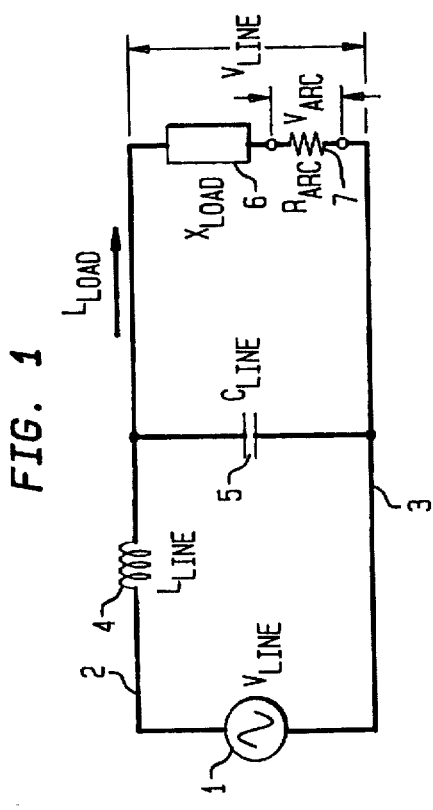
FIG. 1 shows the equivalent circuit diagram of a contact arc.

FIG. 1 shows a simplified equivalent circuit diagram of a contact arc. The line voltage as indicated at 1 is connected across a "high" side conductor 2 and a neutral conductor 3. All line and arc voltages referred to herein are conveniently measured relative to this neutral 3. Typical house wiring, i.e., flat three-conductor cable with the center conductor ground, acts as a transmission line with a characteristic impedance of about 100 Ω. An inductance 4, indicated as $L_{line}$, and a capacitance 5, indicated as $C_{line}$, represent the lumped inductance and capacitance of the power distribution lines. The load 6 is connected in series with an arc gap 7, across which the load current flows when the arc is formed. When the arc is conducting current, the arc gap 7 has an effective resistance indicated as $R_{arc}$ in FIG. 1. The impedance of the load 6, indicated as $X_{load}$, can be resistive, capacitive, or inductive depending on the type of load. Incandescent lights and heating elements are typically resistive. Synchronous motors and fluorescent lights are typically inductive. Some capacitive-start motors appear capacitive before reaching full speed.

FIGS. 2(a)–2(e) show waveforms ("traces") associated with a power line feeding a resistive load through a persistent contact arc as functions of time. Trace 8 (FIG. 2(a)) shows the line voltage, indicating the presence of high-frequency noise 9 throughout the cycle except during the 'gaps' 10 and 11, that is, when the arc is not conducting. Gaps 10 and 11 are typically of similar duration during both half-cycles of the waveform, as shown. The amplitude of the noise is exaggerated for purposes of illustration. The duration of the gaps is indicated as $t_b$.

Figure 2A:
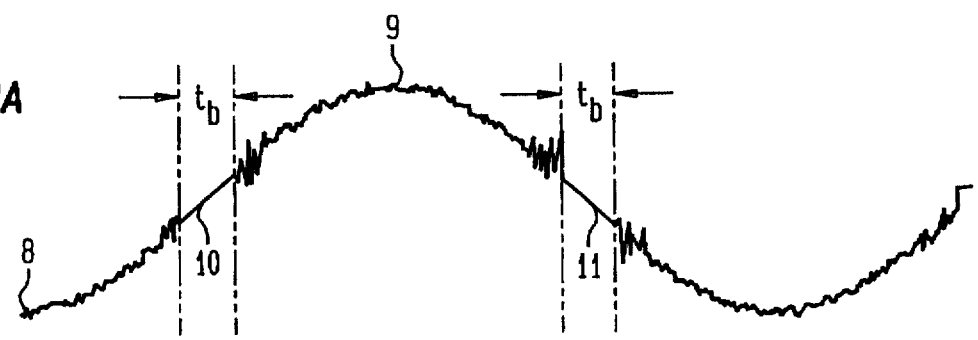
FIGS. 2(a)–2(e) show characteristic waveforms associated with a resistive load that is arcing at one contact as a function of time.
Figure 2B:
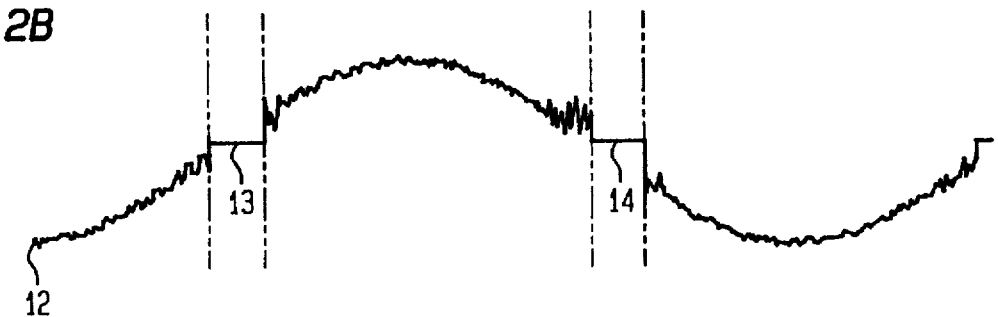

Trace 12 (FIG. 2(b)) shows the current through the load. The high-frequency noise generated by the conducting arc is also present on the current waveform, again exaggerated for clarity. Because the load is resistive, the current 12 is in-phase with the voltage 8 (FIG. 2(a)), and goes to zero during the interval $t_b$ when the arc is not conducting. The high-frequency noise is again present throughout the cycle except during the gaps 13 and 14.

Figure 2C:
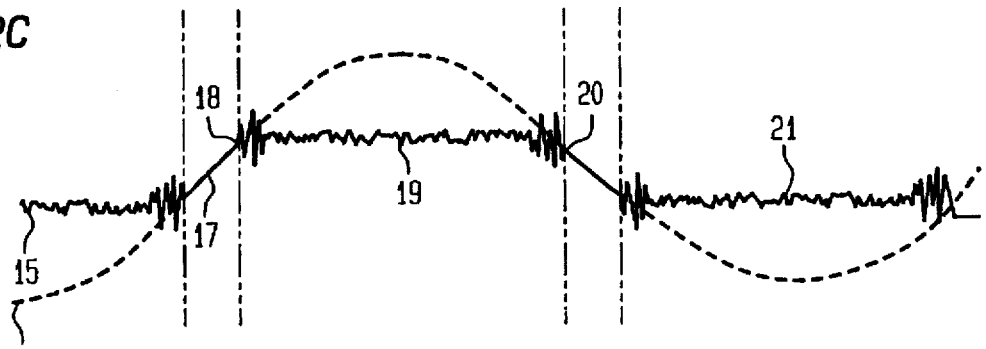

Trace 15 (FIG. 2(c)) shows the voltage across the arc. Trace 16 illustrates the line voltage, i.e., the voltage that would be present across the arc if the arc did not fire, and is included to illustrate the timing of the ignition and extinction of the arc with respect to with respect to the line voltage. Beginning at point 17, the voltage 16 across the arc is zero, so the arc does not conduct and therefore produces no noise. As voltage 16 rises, it reaches a point 18 where the arc ignites and begins conducting current. The voltage across the arc 15 does not go to zero when the arc is conducting because the now-conducting arc has an impedance, typically on the order of several or tens of ohms; consequently a voltage is exhibited across the arc. Furthermore, the arc tends to maintain a fairly constant voltage independent of the current though it. This is illustrated at 19 throughout the positive half-cycle and at 21 throughout the negative half-cycle. The arc produces high-frequency noise continuously during the time it is conducting. At point 20, the voltage across the arc lowers to the extinction level of the arc and the arc extinguishes. This process repeats on the negative half-cycle 21, and thereafter as long as the arc persists.

Figure 2D:
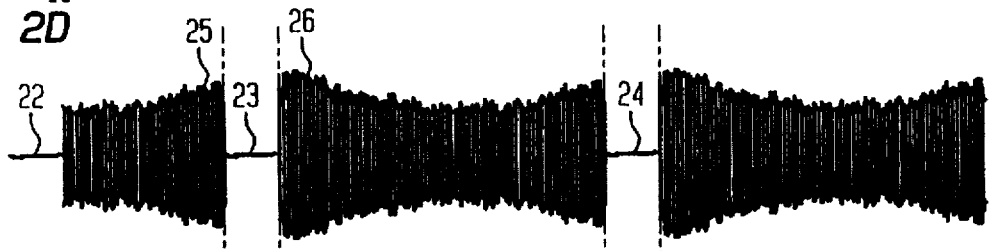

Trace 22 (FIG. 2(d)) shows the high-frequency noise extracted from either the line voltage 8 (FIG. 2(a)) or the load current 12 (FIG. 2(b)). In this case, the noise is generally shown in the higher frequency portion of the emitted spectrum, e.g., 1–10 MHz. A simple high-pass filter serves to remove the line frequency components. As shown, high-frequency noise is present throughout the cycle except during the intervals 23 and 24 when the arc is not conducting. During these intervals, or gaps, the high frequency noise is substantially attenuated, that is, reduced to the level of any background noise, which is normally much lower in amplitude than the amplitude of the noise due to arcing, as shown.

It will be noted that the amplitude of the high-frequency noise is somewhat higher immediately preceding and following the gaps, i.e., at points 25 and 26 respectively, such that the envelope of the noise exhibits a generally concave shape. This is likely due to modulation of the gap impedance by the sinusoidal line voltage. Additionally, with an inductive distribution system, the rapid change in load current as the arc ignites and extinguishes can produce additional high-frequency ringing that may exceed the amplitude of the arc noise in the middle of the cycle.

Figure 2E:
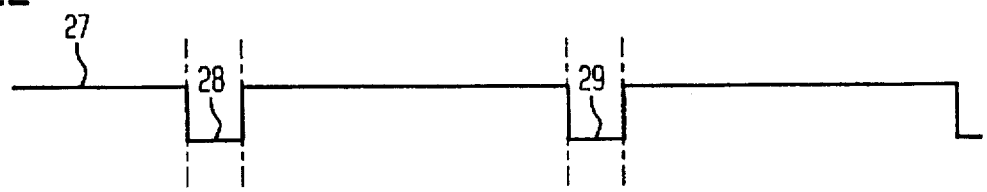
Figure 3A:
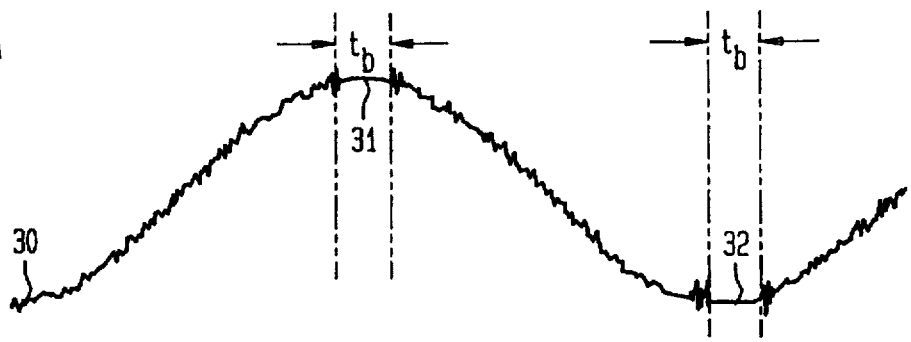
FIGS. 3(a)–3(e) show characteristic waveforms associated with an inductive load that is arcing at one contact as a function of time.
Figure 3B:
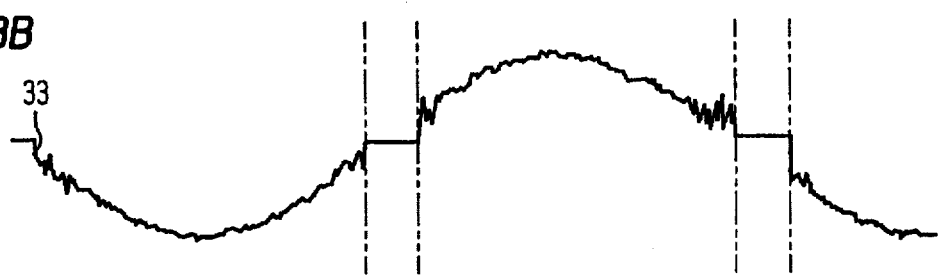
Figure 3C:
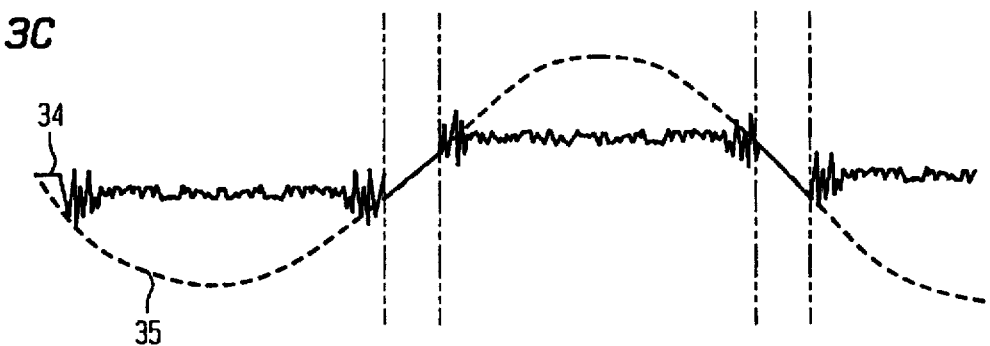
Figure 3D:
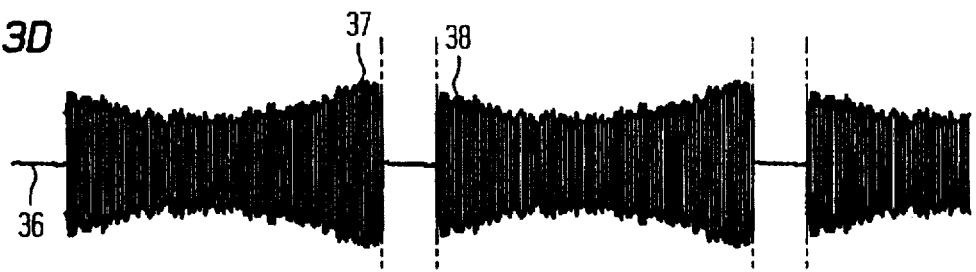
Figure 3E:

Trace 27 (FIG. 2(e)) shows a positive logic signal 27 responsive to the presence of high-frequency noise, i.e., signal 27 is high when high-frequency noise is present and low when noise is absent, as illustrated at points 28 and 29. FIGS. 3(a)–3(e) show the same measurements of FIGS. 2(a)–2(e) with respect to a purely inductive load powered through a persistent contact arc. FIG. 3(a) shows the line voltage 30, FIG. 3(b) the load current 33, FIG. 3(c) the arc voltage 34, FIG. 3(d) the high-frequency noise 36, and FIG. 3(e) the logic signal 39 responsive to detection of high-frequency noise. As can be seen, the difference between these traces for an inductive load, and the traces illustrated in FIGS. 2(a)–2(e) for a resistive load, is that the gaps in the high-frequency noise 31 and 32 occur about 90° later in the voltage waveform. This is because the voltage across the arc 34 (FIG. 3(c)) is delayed by the inductance of the load. As can be seen, the inductance of the load also increases the noise generated when the arc extinguishes at point 37 and re-ignites at point 38. The position of the gaps when a contact arc is in series with a reactive load is thus displaced from the line voltage zero-crossings, but otherwise is essentially similar to the noise due to arcing in a circuit with a resistive load. If the load were purely capacitive, similar characteristic traces would show that the gaps lead the zero-crossings by 90°. In practice, the load will be somewhere between these limits, thereby producing gaps in the range of ±90° from each zero-crossing.

In both FIGS. 2 and 3, the voltage at which the arc ignites depends on the size of the gap, the physical condition of the electrode surface, the temperature, and the environmental conditions in the gap. Given that the sinusoidal waveform completes one full cycle every 360°, the voltage V at any time can be expressed in degrees, i.e., $V = V_{peak} \sin \theta$, where $V_{peak}$ is the peak voltage reached and $\theta$ is the phase angle relative to the zero-crossing. Arcs that ignite at an angle between 60°–90° (145–167 actual V on a 118V (RMS) line) tend to be highly intermittent and unstable because the gap is large. Arcs that ignite in the 20°–60° (57–145V) range are still generally intermittent, tending to occur in short bursts and rapidly self- extinguishing. Arcs in the 1°–20° (3–57V) range may, under certain conditions, persist and become self-sustaining. Arcs in this range emit an audible hiss and may develop extremely high temperatures in the surrounding materials. Thus arcs in the 1°–20° range are particularly dangerous.

Figure 4:
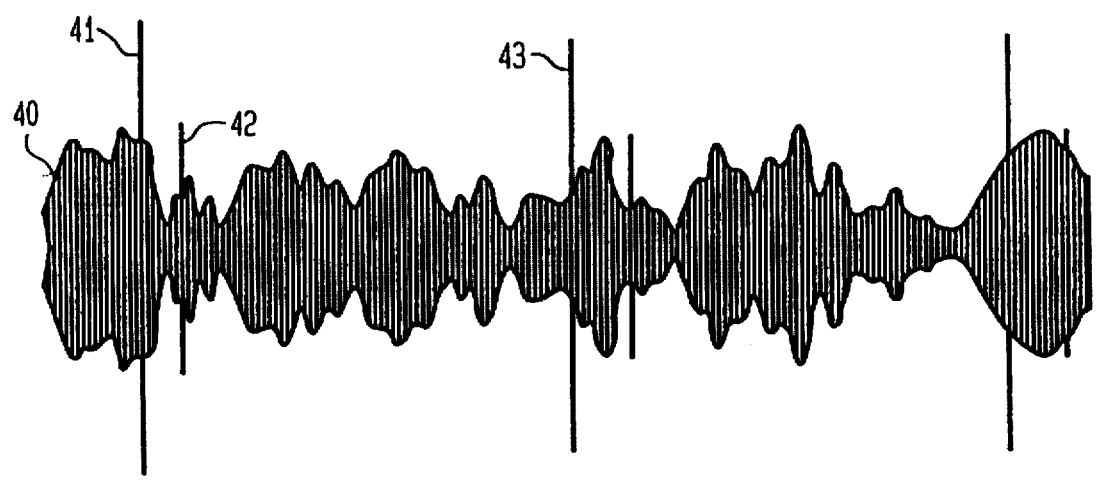
FIG. 4 shows background signals typically present on residential power lines.

The high-frequency noise patterns shown in FIGS. 2 and 3 are nearly 'ideal', in that they exhibit very low background noise and no dropouts. Such ideal patterns, though not impossible, are not typical. In particular, in typical households, there generally exists some level of background noise consisting primarily of impulse noise, e.g., from lamp dimmers and switching power supplies, and broadcast radio signals received by the house wiring. FIG. 4 shows a typical background signal that might be found in a typical residence while monitoring in the range of 1 MHz to 30 MHz. The modulated RF signal 40 results from the reception of one or more local broadcast radio stations or nearby communication equipment. It may be the sum of several signals from disparate sources, but each are discrete, narrowband communication channels asynchronous to the line frequency. The second type of background shown is synchronous impulses (41, 42, 43), from lamp dimmers or other impulse sources on the circuit. The high frequency components of this signal are very short-lived, being only a few microseconds in duration, and these generally occur every half-line cycle.

A third type of noise (not shown) is communication signals from carrier-current transmitters. There are a number of devices on the market that provide remote control of appliances by using carrier-current transmission techniques to convey information over the power lines. These are typically tuned to transmit bursts in the 100–300 KHz range. The amplitude of signal from these sources in the 1–30 MHz frequency range is very low because noise in this band would interfere with AM radio broadcast reception and is therefore intentionally minimized by the manufacturers of such devices.

The amplitude of the background noise originating from radio wave reception is strongly dependent on both the length of the wiring and less so on the loads present. Typically, the amplitude of even the strongest radio waves on the lines is on the order of 1/10 the amplitude of the arc noise generated by an arc in series with a 150 W light bulb.

Figure 5A:
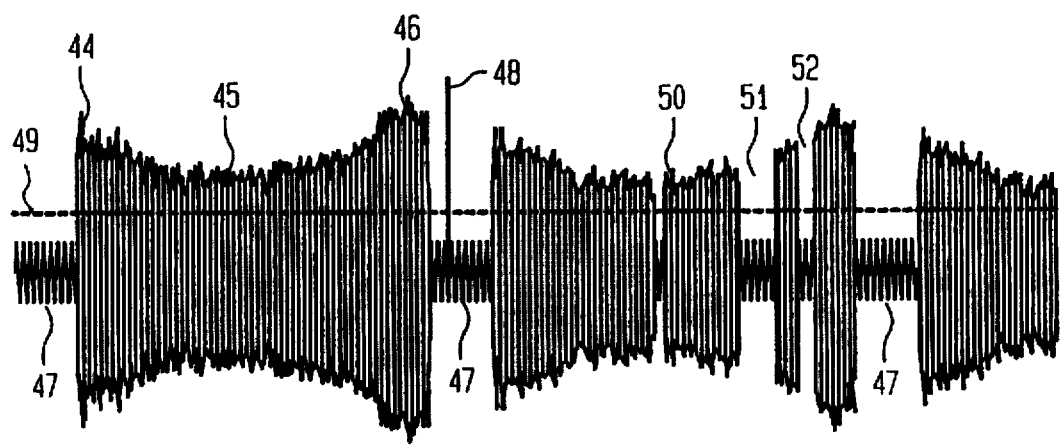
FIGS. 5(a) and 5(b) show a less than ideal arc noise pattern and a binary signal responsive to that pattern, respectively, both as functions of time.

Referring now to FIG. 5(a), a more typical non-ideal pattern, including arc noise and background noise, is shown, extending over a little more than one full line cycle. As shown at 44 and 46, and as discussed previously, the noise is higher in amplitude just before and after the gaps 47 than between the gaps at 45 and 50. A high level of background noise is apparent in the gaps 47 when the arc is not conducting; a single impulse spike 48 happens to occur in the second gap. While the first half-cycle is consistent and uninterrupted, the second half-cycle shows dropouts (50, 51, 52) caused by random variations in the physical gap. The temporal position and width of these dropouts are random and likely result from microscopic "blow-outs" on the contact surface. Depending on the persistence of the arcing, there may exist in any one cycle any number of dropouts, in addition to the synchronous gaps 47 that are necessarily present.

Figure 5B:
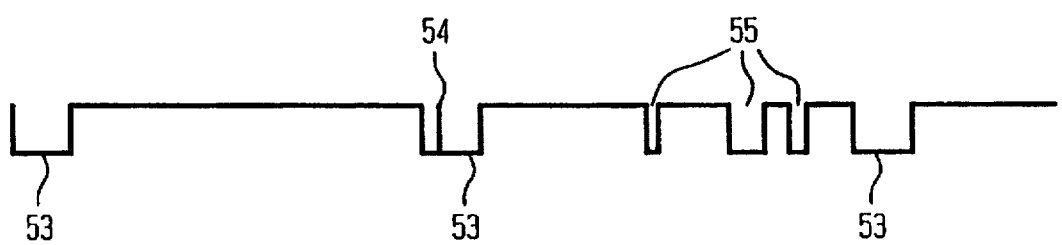

A threshold indicated at 49 may be set to an appropriate level relative to the amplitude of the waveform. By comparing the detected high frequency noise to this threshold, a binary signal is produced (FIG. 5(b)) that indicates the presence of high frequency noise, or conversely, the presence of gaps. The synchronous gaps, corresponding to the zero-crossings of the arc voltage, are shown at 53 together with the impulse and dropout transitions 54 and 55 corresponding to the events shown in FIG. 5(a).

In the parent patent, and the predecessor applications referred to above, various specific methods of analyzing such a logical signal in order to determine whether synchronous gaps are present were disclosed. In general, if the signal is high, indicating the presence of high frequency noise, and if synchronous gaps are present over a predetermined number of line cycles, then arcing is determined to exist and the appropriate action taken.

Figure 6:
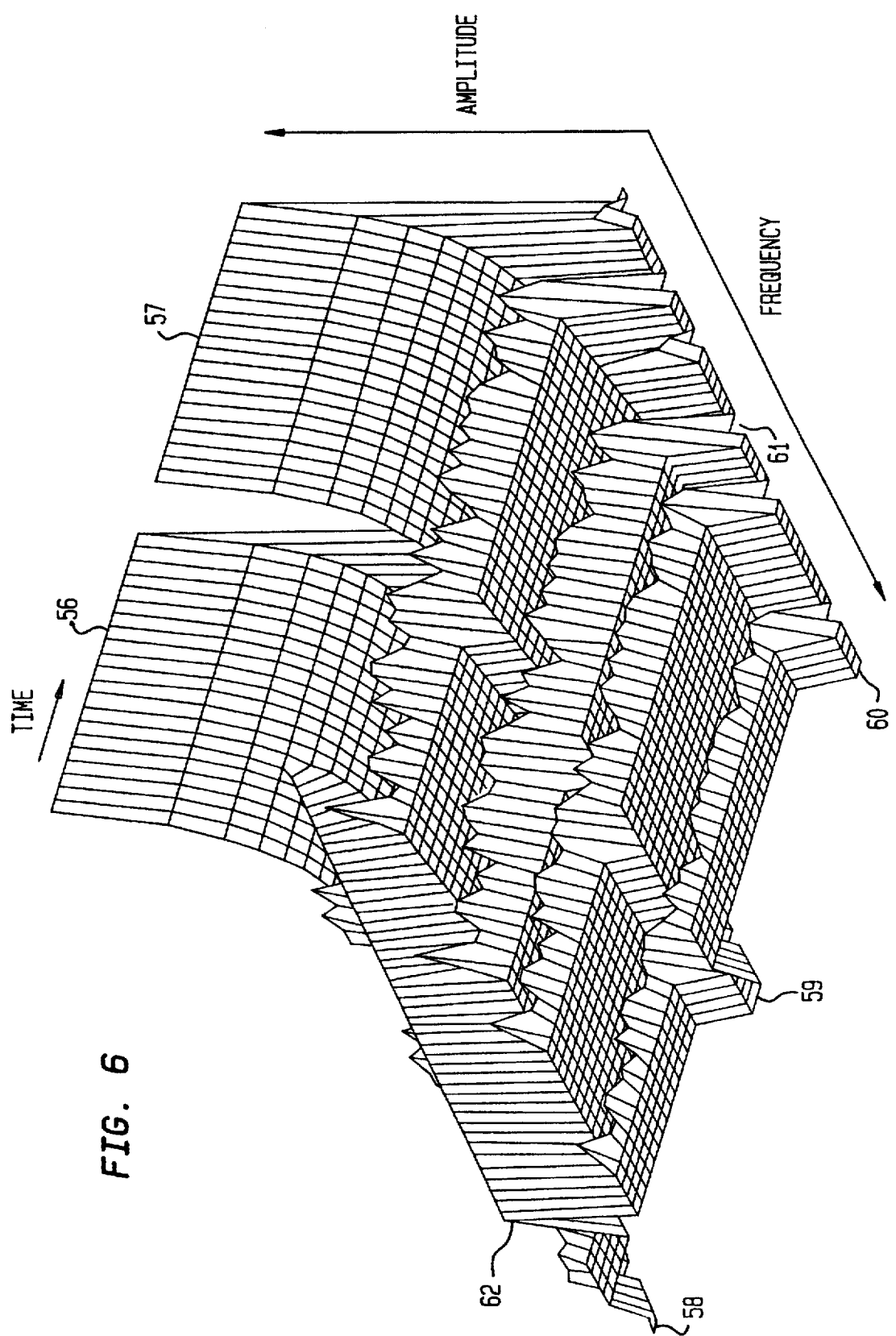
FIG. 6 shows a three-dimensional spectral representation of typical arc-induced noise with spike and AM radio background noise superimposed.

In order to better understand the improved methods disclosed in the present application, it is useful to view the characteristic patterns of arc and background noise in three dimensions, showing a representation of the amplitude of typical signals on a power line in both frequency and time domains simultaneously. Referring now to FIG. 6, idealized arc noise, again over a little more than one line cycle, is shown together with spectra of typical radio noise and impulse noise.

The arc noise can be seen as the two "ski-ramp" surfaces, 56 and 57, originating at the upper right and sloping down to the lower left. Extensive field testing by the present inventor has shown that the noise produced by contact arcing is not "white", but rather tends to be "pink", i.e., the spectral power density of the noise varies inversely with frequency rather than remaining flat across the spectrum, as indicated by the amplitude diminishing with increasing frequency. Synchronous gaps in the noise are shown at 58, 59, and 60, corresponding to the three zero-crossings of the arc voltage along the time axis. By comparison, wideband continuous noise from drill motors and the like (no example being shown in FIG. 6) does not exhibit gaps.

Narrowband background interference, as might be produced by the reception of AM or communications-band broadcast radio transmissions by the house wiring, is shown at several frequencies, an example being at 61. As shown, this specular interference occupies a narrow band on the frequency axis but is essentially continuous on the time axis, forming a plane parallel to the time axis. The variations in amplitude along the time axis shown correspond to audio frequency modulation of the RF carrier. A simple broadband noise detector would detect noise throughout the entire frequency spectrum (the result that would be obtained by compressing the frequency axis to make a two-dimensional plot or by viewing from the lower left corner of FIG. 6) such that even a single instance of specular background noise could fill the gaps 58, 59, and 60, and interfere with their detection. Viewing these specular signals in the frequency domain (as if looking from the lower right corner of FIG. 6), however, it is clear that these specular signals occupy only a very small portion of the complete frequency span.

An example of impulse noise, for example, from a lamp dimmer, is shown at 62. Such impulse noise is characterized by short duration and broad frequency content, forming a plane parallel to the frequency axis. If the impulse were indeed infinitely short, a flat frequency spectrum as shown in FIG. 6 would be produced. In fact, impulse noise produced by lamp dimmers is deliberately 'snubbed' to avoid producing RF noise and therefore rolls-off almost entirely within a few MHz.

As FIG. 6 clearly shows, the character of arc noise 56, 57 is distinctly different from the character of commonly found background signals. The present invention takes advantage of the realization that arc noise is continuous in the frequency domain, and is continuous in the time domain except for patterns of amplitude variation synchronized to the power waveform, e.g., gaps. This realization is relied upon according to the invention to distinguish arc-induced noise from both specular signals, which are narrow in the frequency domain and continuous in the time domain, and impulse signals, which are narrow in the time domain but broad in the frequency domain. In this manner, arc noise can be detected in the presence of even relatively high levels of background noise. Finally, as indicated, arc-induced wideband noise is distinguishable from motor brush noise and continuous wideband noise from similar sources by examination of the amplitude of the noise for patterns of variation synchronized to the power waveform, that is, by analysis in the time domain in order to detect synchronous gaps.

According to one aspect of the present invention, a narrowband detector is swept continuously across a wide detection band, for example, 5–30 MHz, in order to separate out broad band and narrow band noise. The response of such a detector to various classes of noise typically found on household power lines shown in FIGS. 7(a), (c) and (e) is shown in FIGS. 7(b), (d) and (f), respectively. Specular interference, as shown in FIG. 7(a), e.g., due to background broadcast radio signals, will produce a peak in the output of the swept-frequency detector only when the frequencies coincide. FIG. 7(b) shows the response of such a swept narrowband detector to specular interference as a function of time. The continuous narrowband signal 63 of FIG. 7(a) is transformed into a narrow pulse 64, the width of the pulse being proportional to the bandwidth of the detector. In this manner, specular interference, which is continuous in the time domain (FIG. 7(a)), is filtered into an impulse, which can be conveniently separated from wideband arcing noise.

FIG. 7(d) shows the response of the swept narrowband detector to impulse interference 65 (see FIG. 7(c)), having a broad spectrum in the frequency domain, as shown at 62 in FIG. 6. Such impulse interference (due to switch closure, lamp dimmers, or like sources) is limited in time duration and therefore remains essentially an impulse 66 in the frequency domain.

Arc noise 67 (FIG. 7(e)), however, is continuous in both domains and therefore passes essentially unaffected through the swept-frequency filter as shown at 68 in FIG. 7(f).

It will be understood that the swept-frequency filter technique produces essentially the same result as other methods proposed in earlier applications to determine the whiteness of the noise; the amplitude of wideband noise will pass substantially unaffected, while the amplitude of specular signals will be attenuated. Furthermore, the integral of the output represents the degree of whiteness of the signal, varying from near zero with few or no specular signals present, to full scale responsive to white noise. Accordingly, a simple method of arc detection using swept-frequency techniques according to the present invention consists of monitoring the average amplitude of the output of a narrowband detector swept across a broad frequency range, as a function of frequency. If the signal output by the detector is of relatively consistent amplitude, the noise is wideband. If the amplitude of the noise is determined to be higher than the background noise, it can be determined that arcing exists.

While the swept-frequency detector is thus responsive to arc noise, it cannot distinguish noise due to arcing from other wideband signals that might be present, such as spread-spectrum communication signals or the arcing produced by brush motors. As many applications for arc-detection technology require an extremely low level of nuisance tripping, e.g., before a home arc detector can be accepted commercially, a more selective detector is preferred.

A more selective arc detection method consists of applying the previously disclosed gap detection methods to the output of the swept-frequency detector. As the arc signal passes the swept-frequency detector substantially unaffected, the same time-domain techniques disclosed in the parent patent and predecessor applications can be applied directly, that is, the signal passing through the swept-frequency detector and thus indicative of wideband noise can be examined for patterns of variation in its amplitude synchronized to the power waveform. Accordingly, in one important implementation of the invention, swept-frequency noise discrimination, to eliminate impulse noise and narrow-spectrum interference, is combined with gap detection (more broadly, identification of patterns in the amplitude of the noise signal synchronous to the power waveform), to avoid identification of, e.g., motor brush arcing, as dangerous arcing.

Certain of the gap detection techniques disclosed in the prior applications and parent patent may be described as 'temporal' or as analyses performed in the time domain, in that the timing of the gaps is a key feature of identifying them as due to arcing. One difficulty inherent in applying any temporal gap detection technique to monitored arc patterns arises from the random variations in the arc pattern from cycle to cycle. These occur, as discussed previously, from minute physical perturbations in the contact junction and can cause a substantial number of dropouts in the high-frequency noise produced. These sporadic dropouts appear as additional gaps in the pattern and make detection of the synchronous gaps that characterize arcing difficult. Extensive testing by the present inventor has shown that, while many dropouts may occur in persistent arcing, particularly between soft-metal contacts, the temporal position at which dropouts occur is indeed random, while arc-induced noise is driven by the overall sinusoidal waveform and exhibits synchronous patterns of variation in amplitude.

This understanding has led to yet another improvement, called "synchronous averaging" herein, which substantially reduces the effect of dropouts and allows highly reliable use of the temporal gap detection techniques discussed in the prior applications and issued patent. That is, the noise signal, having been processed according to synchronous averaging techniques, and possibly after passing through a swept-frequency filter, may be examined for the presence of gaps synchronized to the power waveform; their presence is a highly reliable indication of arcing.

Synchronous averaging, in this context, consists of dividing the line cycle into a large number of short sample intervals ("time slots"), and then averaging the noise amplitude measured during each corresponding time slot from one cycle to the next. The sample intervals must be short relative to the gap size in order to accurately reproduce the gaps. In one prototype, the line cycle was divided into 512 time slots, making each sample interval 32.5 µs long. To conserve memory, a weighted running average was used wherein each new average is calculated as the weighted sum of the current sampled amplitude and the previous average for that each time slot. The weighting constants employed determine the effective time constant, that is, determine the number of total cycles over which the average is effectively calculated. This method requires just one average sample value to be stored for each time slot.

The effect of synchronous averaging on the arc pattern is to smooth any variations that are not synchronous with the line cycle. Synchronous averaging effectively improves the signal-to-noise ratio of the arc-induced noise waveform, by eliminating the effect of random variations and accentuating the effect of systematic variation, e.g., synchronous gaps. In other words, the average noise amplitude determined with respect to each sample interval, with successive measurements being spaced precisely one line cycle from the corresponding previous measurement, will gradually rise, in accordance with the averaging time constant, to reach the average value for that time interval. Consequently, all randomly-positioned sporadic gaps, e.g., due to dropouts, are filtered out and a smooth, noise-free gap pattern emerges. FIGS. 12(b) and 12(c) (discussed further below) may be compared to provide examples of a typical noise signal and a synchronously averaged signal, respectively. Traces 134–136 in FIG. 12(c) show the improved discrimination of gaps 137 from the noise signal as the time constant is successively increased.

Figure 8:
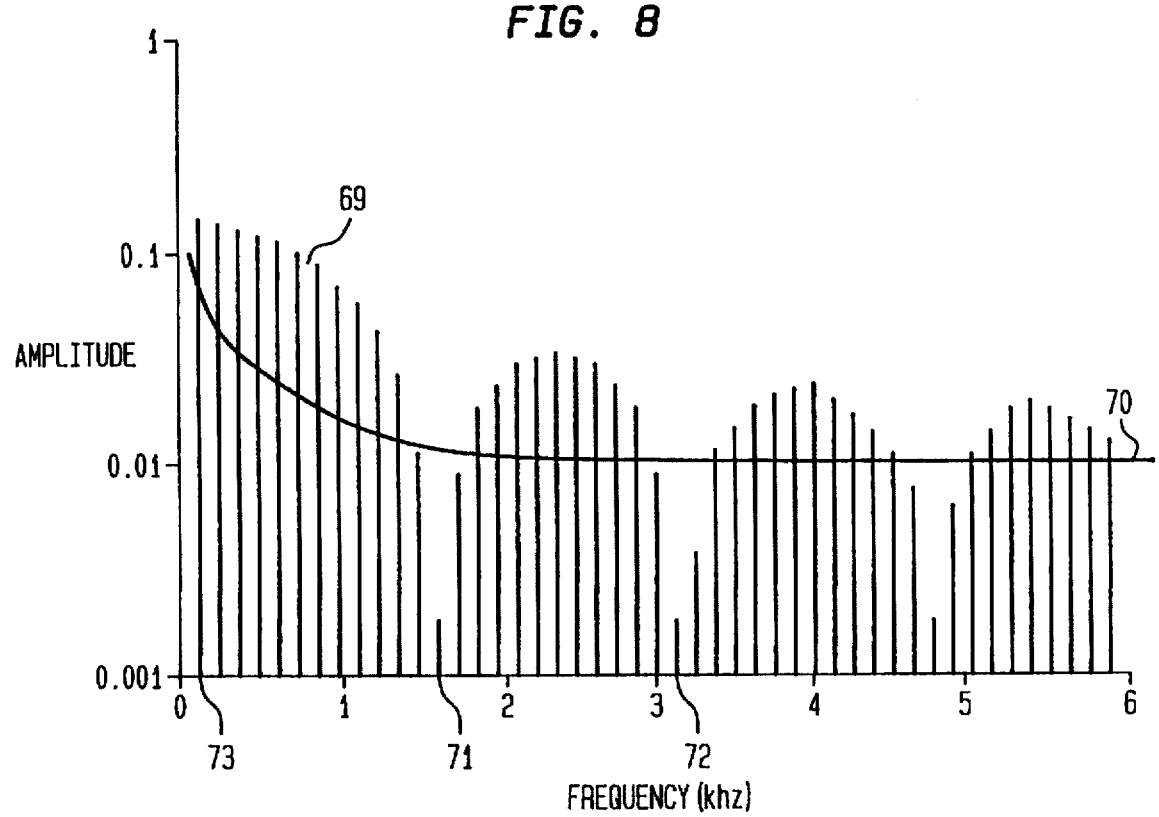
FIG. 8 shows a spectral representation of a typical detected arc noise pattern.

In fact, synchronous averaging followed by temporal gap detection together form a filter system that is optimally matched to the spectral components of arc noise patterns, and is therefore highly selective to such patterns. To better understand this assertion, it is useful to view the frequency spectrum of the patterns of gaps in noise due to arcing. Referring to FIG. 8, such a gap pattern can be represented as the product of a binary gating function (that is, valued as one when the arc is on, and zero when the arc is off) and a random signal that represents amplitude variations in the noise. Since the arc is modulated by the line, that is, because the gaps are synchronous to the line frequency, the spectrum 69 of the binary gating function is a line spectrum with lines at integral multiples of twice the line frequency and an amplitude envelope equal to the absolute value of (sin(ωt)/ωt), where ω equals 2(2π60). This function exhibits amplitude minima 71, 72 at frequencies where ωt is equal to n/G, where G equals the width of the gap and n is any positive integer. Thus, with a typical gap width of 630 microseconds, the first minimum 71 occurs at 1/630 μs=1.59 KHz. The second minimum 72 occurs at 2/630 μs=3.2 KHz, and so on. As the gaps become narrower, minima appear at the higher frequencies, with the limit being a flat response at an infinitely small gap width. Conversely, the wider the gap width (up to 50% duty cycle), the lower in frequency are the first and all successive minima. At 50% duty cycle, the even harmonics drop to zero and the spectral line amplitudes become 1/n, the characteristic spectrum of a square wave.

The line spectrum just discussed is the spectrum of the gating function, which modulates the noise produced by the arc itself. The spectrum of arc noise itself, i.e., with the gating function equal to one, is a continuous spectrum exhibiting the "ski ramp" 1/f amplitude response shown at 56, 57 in FIG. 6, and at 70 in FIG. 8. The composite spectrum (not shown) produced by modulated arc noise is the convolution of two functions 69 and 70.

Given the spectral composition of modulated arc noise shown in FIG. 8, we can now look at the effect of synchronous averaging. First, synchronous averaging implemented as described forms a commutating filter, passing only the fundamental frequency, in this case 120 Hz, and all of its harmonics. In other words, noise components that fall on the spectral lines of FIG. 8 pass unattenuated while noise components that fall between the lines are attenuated; stated differently, synchronous averaging selectively passes only components in the pattern that are synchronous to the line frequency, i.e., are integer multiples of 120 Hz. This alone constitutes an improvement in detector selectivity and as such may be implemented as an arc detector. Such a detector would simply determine that arcing exists if the average amplitude of the synchronously averaged noise exceeds a predetermined threshold.

The use of synchronous averaging alone as an arc detection analysis technique, however, puts no constraints on the relative amplitudes of the various spectral line components. In other words, any noise signal that contains significant components at the specified spectral lines would trigger the detector. Therefore, to better discriminate arc noise it is necessary to qualify the amplitudes of these spectral components as well. As discussed, the amplitude envelope of the spectral lines that result from arcing, as shown in FIG. 8, exhibits minima resulting from the presence of gaps in the noise, and the position of these minima is a function of the gap width. A final step of analyzing the noise for the presence of gaps of widths within a predefined range would better match arcing patterns and therefore further increase selectivity.

Clearly, a Fourier analysis could be performed and the amplitudes of the spectral lines compared to predefined constraints known to be characteristic of arcing. This approach is expensive and, in fact, unnecessary. By simply applying the temporal gap testing methods described in the parent patent and predecessor applications to the output of the commutating filter, the same result is achieved. In other words, while a commutating filter implemented by synchronous averaging passes only the spectral lines, temporal analysis of the output that allows only a preselected range of gap widths to pass produces the same effect as qualifying the spectral line amplitudes. For example, if a stage following the commutating filter passed only patterns with gaps 630 μs wide, the two stages would produce an output only when the precise spectral composition shown in FIG. 8 were present. In this manner, the overall system response is matched to the spectral composition of arc patterns and therefore produces maximum selectivity.

In the following discussion, the arc detector of the present invention is conveniently divided into two circuit subsystems; a "Front-End" which senses, amplifies and detects the characteristic wide bandwidth noise signals produced by arcing, using variable-frequency detection methods, and an "Arc Processor" which monitors the detected signal for the presence of patterns indicative of arcing and which actuates various outputs responsive to the presence of arcing.

1. Front-End Circuits for Variable-Frequency Detection

Two basic variable-frequency detection methods, referred to as the 'heterodyning' and 'swept-filter' methods, are disclosed. However, the invention is not so limited. An embodiment of a front-end that uses the heterodyning principle is shown in block schematic form in FIG. 9, while an embodiment that uses the swept-filter method is shown similarly in FIG. 10. Either circuit effectively sweeps a narrow-band detector across a broad frequency range to remove spectral interference (e.g., broadcast radio signals) and impulse noise. Synchronous variation in the amplitude of the noise can then be accentuated by synchronous averaging. Subsequent processing steps then test for patterns of gaps, duration of the pattern, and the like, indicative of possibly dangerous arcing.

A. Heterodyning Circuit

Figure 9:
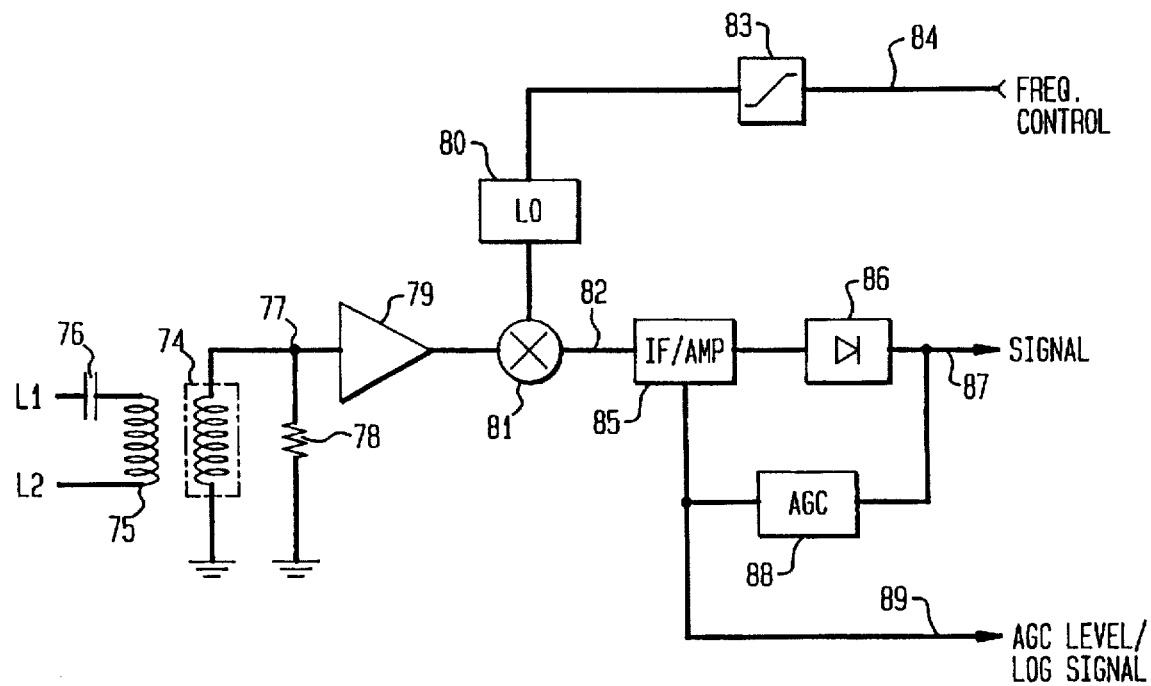
FIG. 9 shows a block diagram of a "heterodyning" front-end.

Referring now to FIG. 9, a transducer 74 is provided for sensing noise on the power line; fundamentally, the transducer 74 is a coil sensing high-frequency noise produced by arcing over a selected frequency range. Details of several embodiments of suitable transducers and sensing circuits are discussed in connection with FIG. 11. Transducer 74 may sense high-frequency noise current superimposed on the line directly, if configured as a coil placed around a suitable toroid, with the high side of the line fed through the center of the toroid, or may sense noise voltage on the line indirectly, by adding a primary winding 75 wired across the line L1, L2 through a decoupling capacitor 76, as shown. Alternatively, the noise voltage can be monitored without isolation by coupling it directly through a small capacitor to the input 77, or by coupling an antenna to receive the RF emissions from arcs. In any case, the transducer in this embodiment should have an approximately flat frequency response in the selected frequency range. This may be facilitated by the addition of a load resistor 78 across the coil.

As stated, and as shown by FIG. 6, arcs produce 'pink noise' in a frequency range extending from 10 KHz to nearly 1 GHz. The preferred portion of this spectrum to be monitored depends on several considerations. First, the total frequency span should be large relative to any specular background present. Second, since the arc noise exhibits a 1/f spectrum, the higher the frequency, the more gain will be required. Third, the frequency band should be selected to exclude any strong background signals. In residential applications, because the most prominent background signals are in the AM broadcast band, it is advantageous to monitor above this band. Fourth, due to the inductance of feed wires, the higher the frequency, the less other loads will attenuate the arc signals. Fifth, the higher the frequency, the more crosstalk exists between adjacent conductors and therefore the more difficult it will be to isolate any one circuit. Consequently, the frequency range to be monitored for detecting arc-induced noise is a trade-off between various considerations and should therefore be optimized for each application. In a residential arc monitor, the frequency range of 5–30 MHz is well above the AM broadcast band and wide relative to other radio transmissions that might be present, and is therefore a suitable choice.

Referring again to FIG. 9, the input signal is amplified at 79 and is then mixed with a swept-frequency signal from a local oscillator 80 in a conventional RF mixer 81 to produce sum and difference signals; normally the difference signal will be chosen as the intermediate frequency (IF) signal at point 82 for further processing.

Noting the ready availability and low cost of IF stage tuned circuits for AM and FM radios, it is convenient to select either 455 KHz or 10.7 MHz as the IF frequency. Bandwidth considerations dictate which is optimal for a particular application.

In general, the gaps in the high-frequency noise caused by arcing represent a nearly rectangular amplitude modulation of the noise. Consequently, the monitored bandwidth will determine the resolution with which gaps can be detected. AM IF circuits typically have a bandwidth of 5–10 KHz, which is too narrow for optimal resolution of short gaps, but may suffice for applications that simply detect changes in the level of wideband noise; accordingly, AM IF circuit components may be useful in certain embodiments of the invention. FM IF circuits have bandwidths ranging from about 100 KHz to 300 KHz and therefore provide much higher resolution of gaps. With an AM IF filter and a detection frequency range of 2–7 MHz, the frequency provided by local oscillator 80 is swept between 2.455–7.455 MHz to produce the desired 455 KHz IF signal. With an FM IF filter and a detection frequency range of 5–30 MHz, the frequency provided by the local oscillator 80 must range from 15.7–40.7 MHz to produce the desired 10.7 MHz IF signal.

The local oscillator 80 is a conventional voltage or current-controlled oscillator providing an output sine wave of frequency responsive to a voltage or current signal provided by a frequency control signal generator 83, in turn responsive to a control signal on control line 84. In the simplest case, frequency control signal generator 83 may produce an asynchronous linear or exponential ramp control signal. Alternatively, frequency control signal generator 83 may provide a control signal of any wave shape desired, including low-frequency noise. If synchronization of the frequency sweep to the line frequency is desired, e.g., as needed by certain analysis algorithms, a control signal may be provided by line 84 to reset the ramp. The optimum sweep rate is that rate which maximizes the asynchronicity between the sweep waveform and the gap pattern. A simple, unsynchronized sawtooth frequency ramp with a period of 11 ms works well for 60 Hz applications.

In more demanding applications, where substantial specular background noise may be present, the frequency control signal generator 83 may comprise a digital-to-analog (D-A) converter controlled by a microprocessor through control line 84. In this configuration, the microprocessor can directly control the frequency provided by local oscillator 80, allowing more sophisticated frequency sweep algorithms. One approach, for example, is to have the microprocessor, during periodic calibration phases, step through the entire frequency range in a series of steps corresponding to frequency sub-bands, and record those frequencies at which substantial background noise is detected. Typically a number of sweeps are made. Where noise is detected in the same set of sub-bands during each sweep, clearly specular noise is being detected, e.g., broadcast radio signals. In subsequent frequency sweeps, these frequency sub-bands are skipped, thereby reducing the background level and increasing the detection signal-to-noise ratio.

The mixer output 82 is then fed into a conventional IF stage 85 consisting of one or more IF amplifiers and frequency-discriminating filters such as LC filters and/or ceramic resonators, to separate and amplify the IF stage frequencies. The IF output is then detected using a conventional AM detector 86 to produce a signal proportional to the RF signal amplitude envelope at 87. The amplitude is also sampled at this point and fed to an automatic gain control (AGC) circuit 88 which controls the gain of the IF stage 85 to maintain the average amplitude constant at the detector output 87. The AGC output signal 89 can be used either to monitor the AGC control level when using standard AGC, or as a logarithmically-compressed detected version of the input signal when using the logarithmic mode (see discussion in Section 2A below).

B. Swept-Filter Circuit

Figure 10:
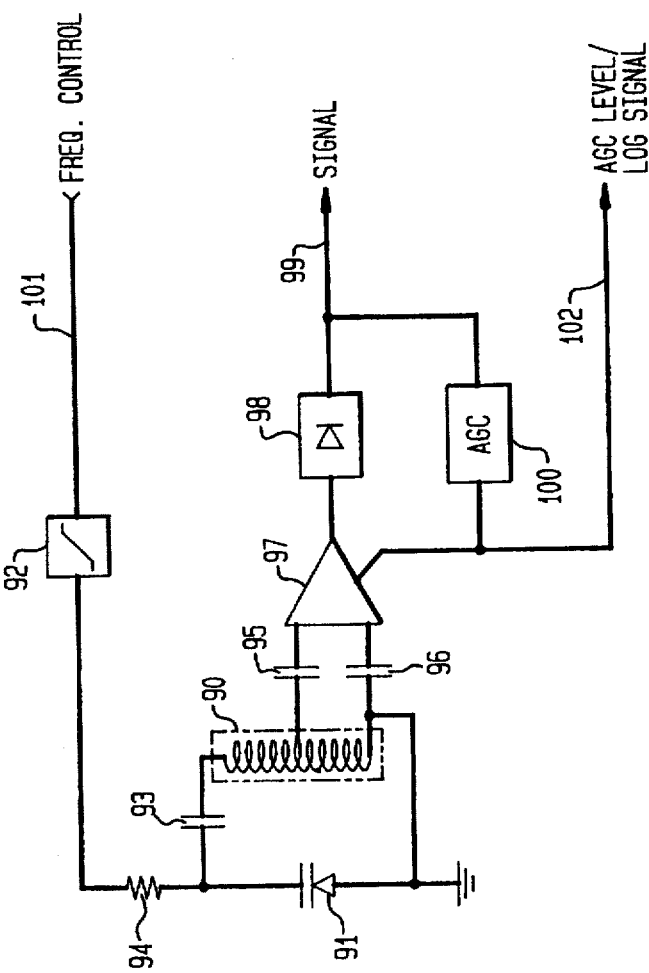
FIG. 10 shows a block diagram of a "swept-filter" front-end.

A second embodiment of a front-end of an arc detector according to the invention, again implementing variable-frequency detection using the swept filter method, is shown in FIG. 10. In this design, variable-frequency detection is achieved through the use of a resonant transducer formed by the sensing coil 90 (arranged for line sensing generally as discussed in connection with FIG. 9) and a voltage-variable-capacitance (Varactor) diode 91. The coil 90 and diode 91 form a parallel resonant tank circuit with the resonant frequency determined by the control voltage provided by the frequency control signal generator 92, optionally responsive to a control signal provided on line 101. Coupling capacitor 93 blocks the DC voltage from the coil 90, while isolation resistor 94 isolates the voltage generator 92 from the tank circuit. To minimize the loading caused by the RF amplifier 97 on the tank circuit and thereby maintain high Q, the amplifier input is connected to a tap on the transducer coil 90 rather than directly across the tank circuit. Coupling capacitors 95 and 96 block the internal DC bias voltages on the input of amplifier 97.

The RF output of amplifier 97 feeds a conventional AM detector 98 to produce the RF signal amplitude envelope at point 99. An automatic gain control (AGC) circuit 100 maintains the average amplitude at this point constant by continuously adjusting the gain of amplifier 97. As described previously in relation to FIG. 9, output 102 can be used either to monitor the AGC control level when using standard AGC or as a logarithmically-compressed version of the detected noise signal, useful in the logarithmic mode (again, see discussion in Section 2A below).

Amplifier 97 can be any variable-gain amplifier with adequate gain and frequency response. The MC1350 from Motorola, designed as a low-cost television IF amplifier, features a 60 db AGC range and a power gain of about 50 db at 45 MHz, and works well in the present design.

As it is desirable to produce a large frequency sweep at low cost, varactor 91 is conveniently selected from a variety of hyper-abrupt varactor diodes designed for digitally-tuned AM radios. One example is the Motorola MVAM108, a low-cost varactor specified to provide a linear capacitance ratio of >15 over a reverse voltage of 1–8 volts. Since tuning linearity is of no importance in the present design, these diodes can be overdriven to extend this ratio to 25 or more. The frequency sweep range is approximately proportioned to the square root of this capacitance ratio.

Having selected the varactor, the required inductance for the sensing coil 90 can be calculated using standard parallel resonance formulas. A frequency range of about 7 to 30 MHz is obtained when the inductance of coil 90 is 1.4 µH, using an MVAM108 varactor 91, and a reverse voltage ramp of 0.5 to 10.5 volts.

In the wideband transducer circuit of FIG. 9, a resistor 78 was provided to load the transducer and thereby flatten the frequency response, as noted above. With the resonant transducer of FIG. 10, just the opposite is required, i.e., the effective parallel resistance across the tank circuit should be made as high as practical to maintain high Q, on the order of 50–100 for residential arc detectors. To keep the Q above 50 at 30 MHz, the effective parallel resistance must be kept above 13 KΩ. Since the real part of the input resistance of amplifier 97 is about 3 KΩ, the amplifier is fed from a tap on the coil to avoid loading the tank. If the MC1350 chip is employed as amplifier 97, and if a tap located about ¼ the total number of turns on the coil from one terminal is used, the Q is about 50 and approximately constant throughout the frequency band of interest.

The resonant transducer swept-frequency circuit of FIG. 10 offers one particular advantage over the heterodyne design of FIG. 9. As stated, arc noise has been found to exhibit a nearly 1/f frequency spectrum, i.e., the arc noise spectral power is inversely proportional to frequency. Using a constant bandwidth detector, as is the case with the heterodyning circuit of FIG. 9, the noise amplitude will fall as the frequency rises. With the constant-Q detector of FIG. 10, however, the increasing bandwidth as frequency goes up compensates for the decrease in noise amplitude, thereby producing a flat response with respect to the characteristic arc noise amplitude characteristics.

C. Transducer Configurations

Current-sensing transducers employed with the circuit of FIG. 9 desirably have a flat frequency response across the sweep range, while those used with the FIG. 10 circuit should be resonant transducers tuned with a variable resonating element. In either case, the transducer used to sense high-frequency arcing noise by monitoring current (as convenient in the case of an arc detector according to the invention configured as a circuit breaker) can assume various configurations, depending on specific application requirements.

FIGS. 11(a, c, d, e, and g) show transducer circuits; in each the power source is from the left and the load is to the right. Referring now to FIG. 11(a), the simplest method feeds the high side of the line (L1) through a toroidal current transducer 105 to the load. To maximize the arc noise current ($I_{arc}$), and to attenuate high-frequency signals coming from the power source, a shunt capacitor 106 can be added upstream of the sensor. As shown, the capacitor 106 should be a four-terminal device connected closely to the power conductors, to minimize inductance effects in the leads. Since the toroidal coil 105 sees the full 60 Hz load current, it should be wound on a powdered-iron or air core to avoid saturation.

Although powdered-iron cores will not saturate appreciably with line currents up to 60 amperes or more, the best core material is air or another non-magnetic material which will not saturate under any load current. Air-cored coils, however, must be considerably larger than coils with ferromagnetic cores to achieve the same inductance. Realizing that the inductance is proportional to the winding loop area and inversely proportional to the mean winding diameter, the present inventor has designed a new coil configuration optimized for arc sensing applications. As shown in FIG. 11(b), the coil 108 is wound around a non-magnetic cylindrical form 107; in use the high side of the line would be threaded through former 107. This design simultaneously maximizes the loop area and minimizes the mean coil diameter thereby greatly increasing the inductance. Several 1.4 microhenry transducers have been made in this manner with outer diameters as small as ⅜ inch and lengths as short as ½ inch, and have been successfully tested. The inductance design equations can be readily derived by one of skill in the art.

Figure 11A:
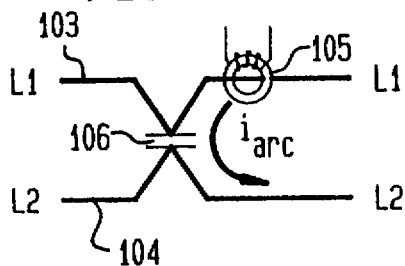
FIGS. 11(a)–11(h) show various transducer configurations useful in implementation of the invention.
Figure 11E:
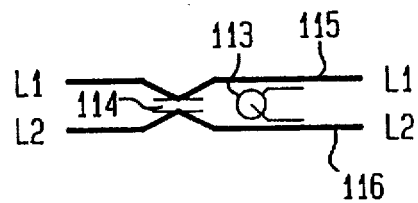
Figure 11B:
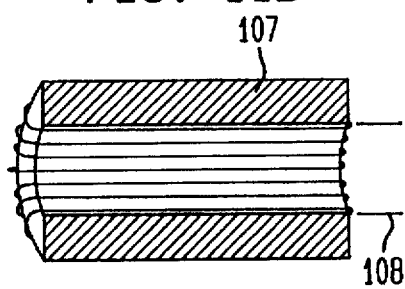
Figure 11F:
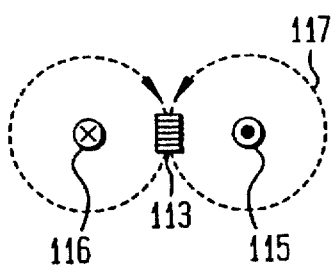

Because the two conductors in paired cables occupy essentially the same physical space relative to the wavelengths involved, radio signals and other externally induced interference will produce common-mode current flow in paired cables. Arc noise, on the other hand, produces differential current flow. Therefore, by using differential current sensing, common-mode signals can be reduced and differential-mode signals increased. FIGS. 11(c, d, e, and g) illustrate four circuits implementing differential current sensing, while FIG. 11(f) illustrates the location of the sensing coil in the circuit of FIG. 11(e), and FIG. 11(h) shows a novel transducer assembly used in the FIG. 11(g) circuit.

Figure 11C:
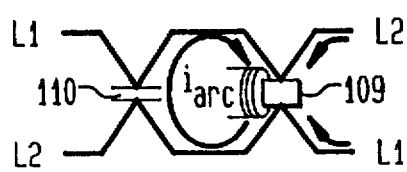
Figure 11G:
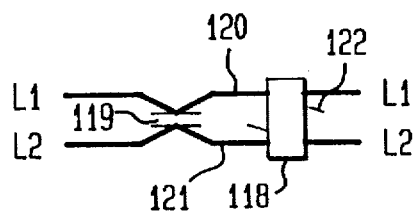
Figure 11D:
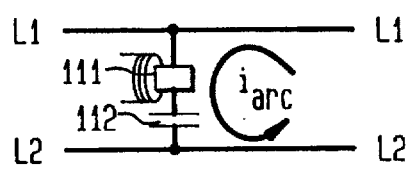
Figure 11H:
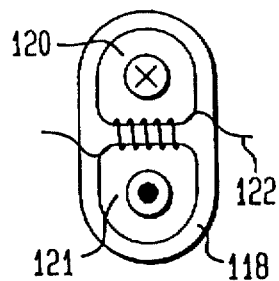

One method simply passes the line current-carrying conductors through the transducer differentially, that is, the lines cross within a toroidal or cylindrical current transducer 109, as shown in FIG. 11(c). Again, a shunt capacitor 110 can be added upstream for the reasons discussed above. If it is not convenient to feed the line conductors through a sensing coil, as may be the case in high-power applications, two alternative methods are disclosed herein. The first, illustrated in FIG. 11(d), uses the current transducer 111 to measure the high-frequency current flowing through the shunt capacitor 112. Since the shunt capacitor provides a virtual short for high-frequency currents, the transducer 111 effectively measures the arc noise current ($I_{arc}$). However, this method is equally responsive to high-frequency currents originating from the power source and from the load.

A second approach for high-power applications is illustrated in FIG. 11(e). In this case, a transducer 113 comprising a simple solenoid winding is positioned between paired conductors 115 and 116, orthogonal to the plane formed by them, together with an upstream shunt capacitor 114. FIG. 11(f), a cross-sectional view of FIG. 11(e), shows the relation of the magnetic fields from the conductors 115, 116 to the transducer 113. As shown, a differential current flows into conductor 116 and back out through conductor 115. The resulting magnetic fields 117 are additive at the transducer 113. Common mode currents will produce opposing magnetic fields at the coil and thus cancel. Since the magnetic field strength is proportional to distance, the transducer 113 should be sandwiched between the two conductors 115 and 116 for the most complete rejection of common-mode noise. An advantage of this approach is that one or more simple RF chokes may be used as transducer 113; however, since the magnetic path is not closed, the transducer will also respond to stray magnetic fields in its vicinity.

A further transducer embodiment containing the magnetic field is shown at 118 in FIGS. 11(g and h). A double-barrel powdered-iron core 118 is placed around the two line conductors 120 and 121 with a shunt capacitor 119 upstream. As shown in FIG. 11(h), the line conductors 120 and 121 are fed through the apertures in the molded core 118, such that the current flows are opposed, while the sensing coil 122 is wound around the center divider. Since the winding form 118 is rectangular and a ferromagnetic material is used, relatively small differential transducers can be fabricated in this manner.

2. Arc Processor Circuits

As discussed earlier, arc detectors according to the invention include an 'arc processor' which examines the signal from one of the front end circuits discussed above for detecting the presence of patterns indicative of arcing, and actuates various outputs responsive to the presence of arcing. In the simplest case, the output of the variable-frequency detector could be integrated to determine that arcing exists if the signal level present over a wide frequency band is substantially higher than background signal levels. This approach, however, cannot distinguish between arcing and other wideband signals that might be present, such as spread-spectrum communication signals. It is therefore necessary to further require the presence of synchronous gaps or other synchronous patterns of amplitude variation in the arc noise before determining that arcing exists.

A. Threshold Method

The "Threshold Method" of synchronous gap detection is based on comparing the detected signal to a threshold to produce a binary signal responsive to gaps in the high-frequency noise. This binary signal is then analyzed using one of a variety of predetermined temporal algorithms, including those discussed in the parent and predecessor applications, to determine if arcing exists. When threshold detection is used, the effective sensitivity of the microprocessor is limited to that of the discrete threshold detector. Accordingly, it is advantageous to optimize the threshold detector so as to accurately detect gaps. Several methods have been developed to accomplish this.

A first method recognizes that if the average background noise is low relative to the arc noise, the gaps will have a much lower amplitude than the variations in the noise during arcing. However, on a linear scale, the amplitude minima during arcing can be as low as a few percent of the peak amplitude. With a simple threshold detector, the optimum threshold level would be on the order of a fraction of a percent of the peak noise amplitude. Accordingly, one improvement consists of using a threshold detector having a non-linear, approximately logarithmic transfer response to compress the amplitude variations that occur during arcing and effectively amplify the gap signal.

Figure 12A:
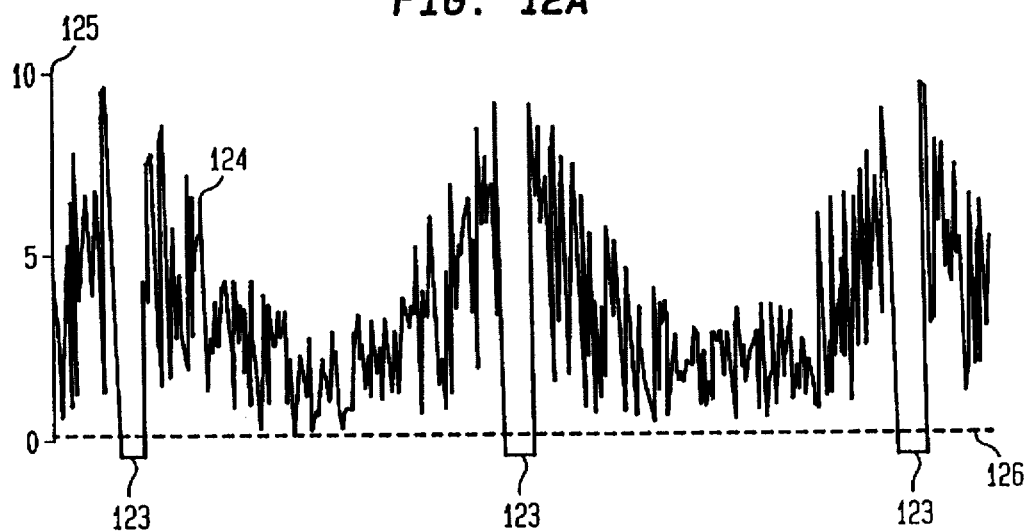
FIGS. 12(a)–12(c) show waveforms provided by several embodiments of arc detectors according to the invention.
Figure 12B:
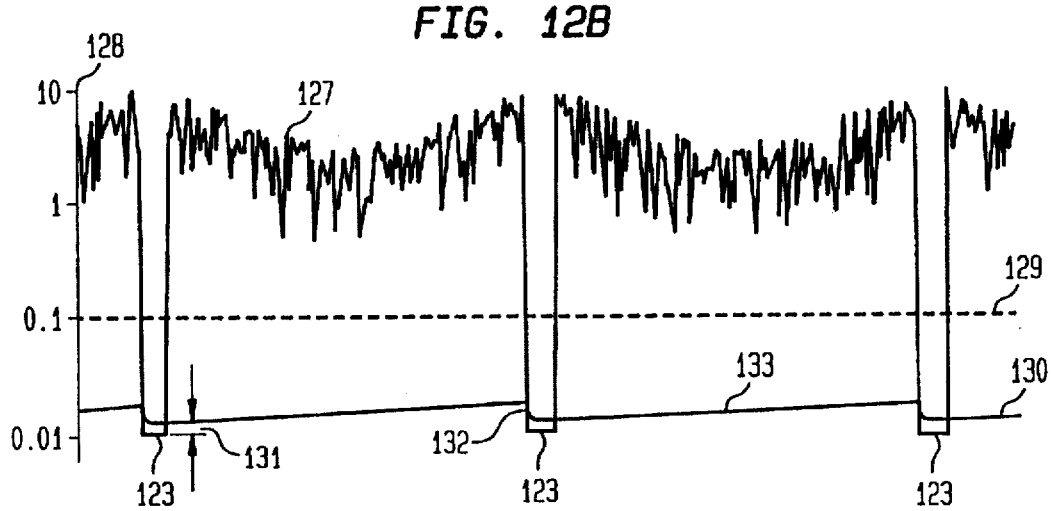
Figure 12C:
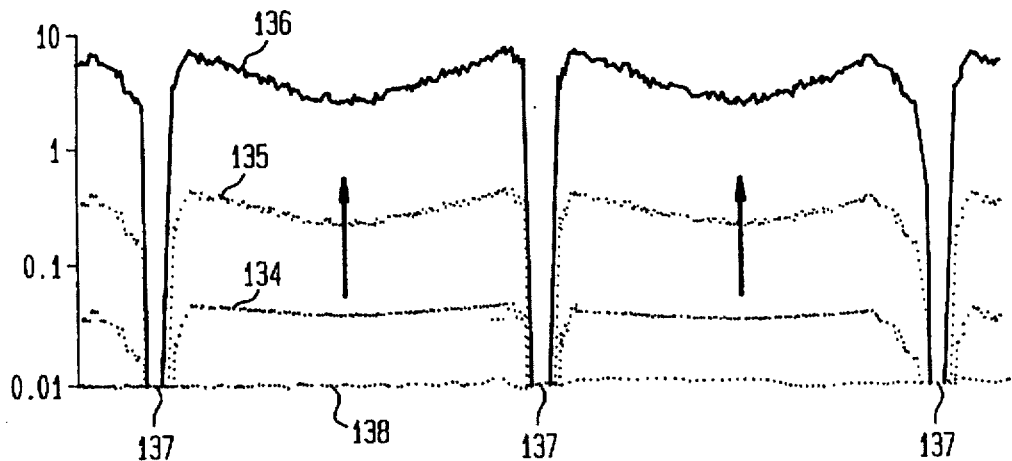

FIG. 12(a) shows a typical arc noise signal 124 plotted on a linear scale 125 with a simple threshold detection level 126 set just above the level of background noise in the gaps, but below the minima of the arc noise. As can be seen, between the gaps 123, the arc noise signal closely approaches the threshold level 126; if they coincide, a false gap will be detected. FIG. 12(b) shows the same arc signal 127 plotted on a logarithmic scale 128. As shown, the nonlinear transfer characteristic compresses the arc noise variations and extends the relative height of the gaps, allowing a higher threshold 129 to be set and providing cleaner, more reliable switching transitions.

Such a nonlinear transfer function could be implemented directly by utilizing a high-frequency logarithmic amplifier. However, since the gain control on variable-gain amplifiers is typically logarithmic (or quasi-logarithmic), it is convenient to use this characteristic to achieve the same result. In conventional AGC circuits, the time constant of the AGC is made large relative to variations in the signal so that the signal remains undistorted as the gain is varied. However, by reducing the time constant of the AGC to the order of the signal variations themselves, the AGC output signal 89 from AGC amplifier 88 (FIG. 9) or AGC signal 102 from AGC amplifier 100 (FIG. 10) can itself be used as the input signal to the threshold detector; the AGC signal amounts to a logarithmically-compressed noise signal 127 as shown in FIG. 12(b). This provides the added advantage that the overall frequency response can be conveniently adjusted by changing the AGC time constant.

Referring again to FIG. 12(b), a comparator in the threshold detector (circuitry thereof being discussed below) is provided to compare the arc signal 127 to a threshold 129 to produce a binary signal responsive to gaps 123. The actual signal level during the gaps, however, is background noise that may vary considerably from the level shown. Accordingly, a second improvement over simple static threshold detection employs a dynamic threshold derived from the signal itself. The optimum threshold level is just above the background signal level in the gaps and, as this may vary, the threshold level should be varied accordingly. This can be accomplished simply by feeding the input signal 127 to a conventional negative peak detector with a fast attack and slow decay time, and using its output plus a fixed offset 131 as the dynamic threshold 130. As shown at 132, the attack time of the peak detector should be fast relative to the typical length of gaps 123, while the decay time 133 is made much slower, on the order of 1–10 line cycles. Of course, other circuits producing a dynamic threshold just less than the negative peaks (i.e., minima) of the arc signal may be employed to the same advantage.

Referring now to FIG. 13, a generalized block diagram of an arc processor using threshold detection methods is shown. A logic module 139 analyzes the input signal 140 from a variable-frequency front end (as in FIGS. 9 or 10, for example) to determine if synchronous gaps are present using one of a variety of predetermined algorithms, including those discussed in the parent patent and predecessor applications, and actuates one or more control outputs if arcing is determined to be present. For example, relay or solenoid trip mechanism 141 may be provided to interrupt current to the load, extinguishing the arc. An LED or other visual indicator 142 may be made to flash when arcing is present but is not persistent enough to trip the detector, or to indicate that arcing has occurred during some predetermined time interval, e.g., over the last 24 hours, and/or to indicate that the breaker has been tripped responsive to arcing. Finally, an audible annunciator 143 may be added to provide an additional alarm that arcing has been detected. If the device is configured as a circuit breaker, i.e., serves to interrupt current flow, a switch 144 may be used to provide a convenient means for the user to reset the unit and/or to reset the visual or audible indicators.

Logic module 139 may conveniently be a low-cost microprocessor either with or without on-board analog-to-digital ("A-D") conversion capability. Alternatively, logic module 139 could be made from various combinations of discrete logic and/or analog circuits. For lowest cost, a comparator 145 compares the input signal 140 to a dynamic threshold 146 formed by negative peak detector 147 as previously discussed. In this case, the input signal 140 is converted to a binary signal 148 responsive to the presence of gaps; logic module 139 evaluates the timing and temporal position of the gaps to determine if patterns characteristic of arcing are present, and if these patterns persist long enough to determine that potentially dangerous arcing exists. This implementation has the advantage that the logic module 139 need not have integral A-D conversion capabilities and is therefore lower cost. The input signal 140 is preferably taken from the Log Signal output of the front-end to minimize the number of false gaps, as previously discussed.

For more demanding applications, a microprocessor with integral high-speed A-D conversion capability can be used as logic module 139. In this case, the input signal 140 may be fed directly into an analog input 151 on the microprocessor 139 and conversions made substantially continuously. The derivation of a dynamic threshold, gap width and position measurements, pattern integration, and the determination whether arcing is present are all performed numerically on the byte stream representing the input signal. Additionally, synchronous averaging, as discussed in Section 2C below, can be implemented directly in software.

The input 140 may be linear, as is the case if conventional AGC is used in the front-end, or logarithmic, as discussed in Section 2B below. If the linear mode is used, the AGC level may be additionally input to a second A-D channel 152 and used to relate the actual signal level to previously recorded background levels. To synchronize this comparison to known noise frequencies, a "Frequency Control" line 150 may be provided to reset the ramp signal generator (e.g., 92 of FIG. 10) and thereby synchronize the frequency sweep with the processor algorithm. In this way, signals of frequencies known to correspond to broadcast radio signals and like specular sources are omitted from the signal considered in arc determination.

A zero-crossing detector 149 is also optional and may be implemented if the algorithm selected requires synchronization with the line frequency or if verification of the line frequency is desired. In United States domestic applications, the line frequency is generally stable enough that a separate time base, e.g., a crystal oscillator, may be used as a test for synchronicity. However, even when synchronization is not required, it may be useful to monitor the line frequency in order to make the same device useful in countries with varying or different line frequencies.

If a microprocessor is employed to implement logic module 139, it may be any of a number of commonly available single-chip microprocessors with the requisite functionality. For the external comparator designs, a model PIC16C54 from MicroChip Technology works well. An expanded version of this chip with four integral, high-speed A-D channels, the model PIC16C71, can be used to implement the direct conversion designs. Alternatively, the Motorola 68HC05 series provides a broad range of capabilities, with or without A-D channels.

B. Peak-Integral Method

Using one of the threshold-detection methods described above, the software algorithm implemented by the microprocessor determines generally whether characteristic gaps are present every half-cycle of the line frequency and whether arc noise is substantially present everywhere except for these gaps. The gap width during persistent, dangerous arcing is on the order of ¼ cycle or less, often as short as several percent of the half-cycle. In fact, short duration gaps indicate more persistent arcing, because when the gaps are narrow the electrons and electrodes do not have a chance to cool off before the arc is re-ignited and therefore the re-ignition voltage remains low. As the gap widens, the re-ignition voltage rises and the arc therefore tends to become intermittent.

Accordingly, a second method for synchronous gap detection provided according to the invention recognizes that the duty cycle of the swept-frequency detected signal (that is, the percentage of the line cycle during which the noise exceeds a threshold) is high during dangerous arcing, while its duty cycle during periods of even significant background noise is low, and uses this characteristic to determine if arcing exists. Furthermore, this method recognizes that the shorter the gap, the more persistent and dangerous the arcing is and therefore the quicker the determination should be made that arcing exists. The "peak-integral" method of arc detection described here does not require a microprocessor for implementation and therefore is suitable for low-cost arc detectors according to the invention.

More specifically, arcing can be detected reliably by determination that the amplitude of the noise signal exceeds a threshold value during a fraction of the line cycle approaching but not reaching 100%. Stated differently, if high-frequency wideband noise is present throughout the line cycle (i.e., the duty cycle is 100%), it is not due to arcing since, as above, noise due to arcing exhibits gaps. Accordingly, monitoring the duty cycle while requiring the amplitude of the noise to drop simultaneously in substantial synchronism to the power waveform is another way of detecting variations in the amplitude of the noise indicative of arcing.

Figure 15A:
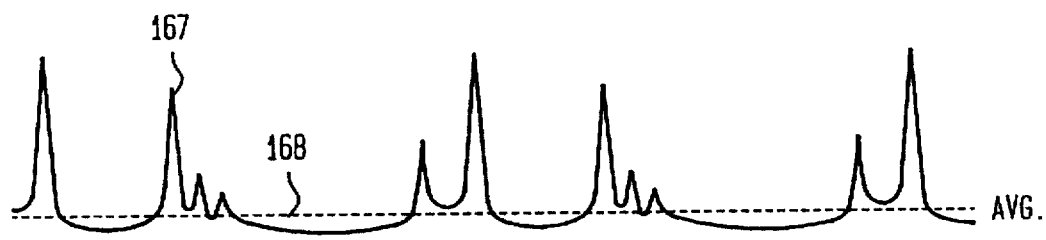
FIGS. 15(a)–15(d) show waveforms related to the "peak-integral" method of arc detection.

Referring first to FIG. 15(a), the logarithmic detected output 167 of the swept-frequency detector is shown under circumstances when there is no arcing, but substantial background noise is present. The peaks shown correspond to those times when the passband of the swept-frequency detector is temporarily aligned with specular background signals. As can be seen, the duty cycle is low and therefore the average signal level 168 is correspondingly low.

Figure 15B:
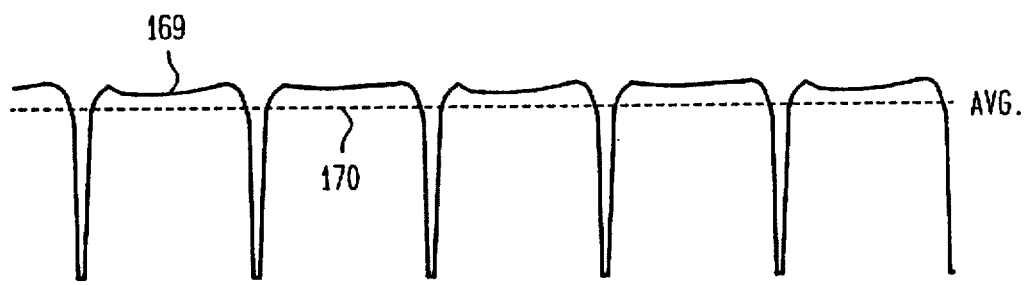

FIG. 15(b) shows the same output with arcing present. Since the detected signal 169 is high throughout most of the cycle, both the duty cycle and the average level 170 are correspondingly high. In general, the closer the average is to the positive peak, the higher the duty cycle—that is, the more high frequency noise is present on the line—and therefore the more likely it is that arcing exists. Conversely, the closer the average is to the negative peak, the more likely it is that the noise is due to background interference.

A block diagram of a circuit that employs a "peak-integral" method of arc detecting, effectively distinguishing between the FIGS. 15(a) and 15(b) patterns, is shown in FIG. 14. The log of the swept-frequency detected signal 153

(e.g., the output of AGC circuit 88 of FIG. 9 or output 102 of AGC element 100 of FIG. 10) is first AC coupled through a capacitor 154 and referenced to DC ground 155 through resistor 156. Conventional positive and negative peak detectors 157 and 158, respectively, monitor the peak signal excursions relative to the ground reference 155. The outputs of the peak detectors are added together with a small positive offset voltage $V_O$ in summer 159 and then fed to a conventional inverting integrator 160. Accordingly, the integrator 160 measures the duty cycle of the noise signal, effectively measuring the total high-frequency energy on the line. If the integrator output 161 rises to a predetermined threshold, threshold detector 163 will trip indicating that arcing exists.

Figure 15C:
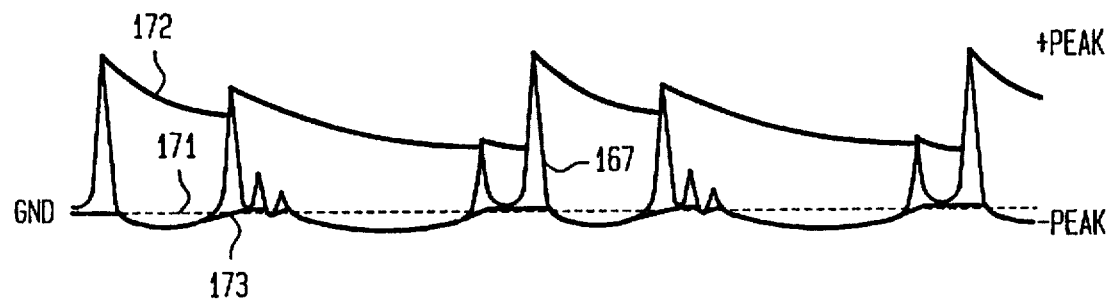
Figure 15D:
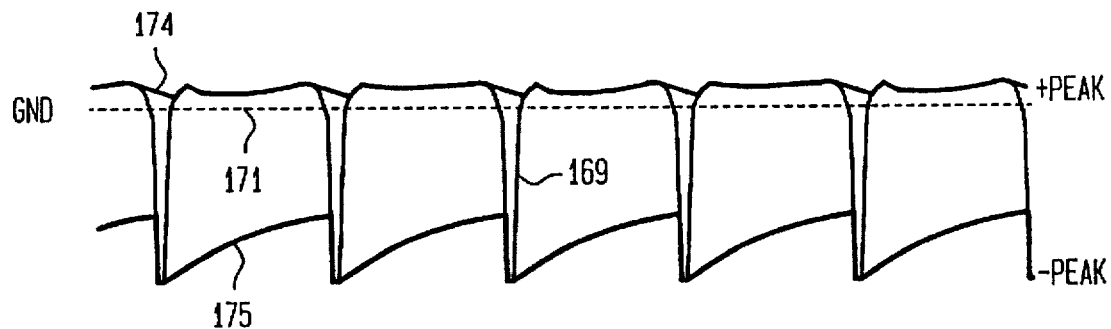

Operation of this circuit is best understood with reference to FIGS. 15(c) and (d). FIG. 15(c) shows signals 172, 173 corresponding to the outputs of peak detectors 157, 158 in response to the background noise shown in FIG. 15(a), while FIG. 15(d) shows the signals provided by the peak detectors in response to arcing-induced noise, as in FIG. 15(b).

Significant features of the operation of the FIG. 14 circuit are as follows. First, the detected signal is AC coupled to force its average value to a fixed DC reference, in this case ground. This can be seen in FIGS. 15(c) and 15(d) wherein the average 171 of the detected signals 167 and 169 is now at ground.

Second, the excursions of the signal, that is, the positive and negative peaks, are measured relative to ground using conventional peak detectors 157, 158 having fast attack and slow decay times. Accordingly, in FIG. 15(c), the output 172 of the positive peak detector 157 rapidly tracks the signal 167 upward (compare FIG. 15(a)) and then decays slowly until the next peak arrives. The output 173 of the negative peak detector 158 similarly tracks the negative peaks. The decay time constant of these peak detectors should be on the order of one line cycle or more.

Third, the two peak detector outputs are summed at 159 and then fed to an inverting integrator 160 to produce an output 161 responsive to the difference between the positive and negative portions of the total signal relative to ground. That is, the output 161 of the inverting integrator 160 will ramp up or down at a rate proportional to the positive peak area, i.e., the area between the positive peak and ground, minus the negative peak area, that is, the area between the negative peak and ground. Accordingly, as shown by signal 172 shown FIG. 15(c), the output of integrator 160 will rapidly ramp down in response to typical background signals. Conversely, during arcing, the ouput of integrator 160 will ramp up at a rate proportional to the negative peak area minus the positive peak area, and, as shown by signal 175 in FIG. 15(d), will rise rapidly in response to arcing.

In the absence of any input signal, the sum will be indeterminate and therefore a small positive bias voltage $V_O$ provided at 162 connected to the input of the summer 159 forces the integrator output 161 to slowly ramp down to its most negative value. $V_O$ should be on the order of 1/10 the maximum positive peak detector voltage.

It will be appreciated that this simple, continuous analog circuit provides the following advantageous arc detection features. First, for the output of integrator 160 to ramp up, negative peaks, that is, gaps in the noise, must occur regularly. If negative peaks do not occur often enough (i.e., if the duty cycle reaches 100%), the output of the negative peak detector 158 will decay to ground, thereby reducing the negative peak area and consequently the integrator up-ramp rate. If negative peaks occur too often (e.g., due to drop outs or the like, as distinguished from gaps), the average value will be lowered which increases the positive peak area, reduces the negative peak area and likewise reduces (or reverses) the up-ramp rate. Dangerous arcing will produce consistent peaks, and the FIG. 14 peak-integral circuit will detect arcing reliably. Second, the integrator output will ramp up fastest with narrow gaps. Because narrow gaps are the most indicative of persistent arcing, this response is appropriate. As the gap width increases, the integrator output 161 will continue to ramp up, albeit at a progressively slower rate, until the gap duty cycle becomes 50% (¼ of a line cycle) at which point it will begin to ramp down. Since larger gaps are indicative of more sporadic arcing, this is consistent with the requirement of reliable arc detection. Third, the higher the amplitude of the positive peaks, the more clearly indicative the signal is of background noise and consequently the faster the integrator output ramps down. Fourth, and finally, the integrator will ramp up or down at a rate proportional to the amplitude of the input signal. Consequently, the clearer the arcing pattern, the faster the response will be.

Referring again to FIG. 14, logic module 165 serves to actuate one or more outputs, 141–144, as above, if the determination is made that arcing exists. In the simplest implementation, this determination will be made whenever the input 164 from the threshold detector 163 is active. In this case, the logic module 165 may consist of simple, low-cost circuitry to provide the necessary functionality. Note that in this implementation, no microprocessor is required to perform highly reliable arc detection, such that a very low-cost, highly reliable arc detector can be provided. The logic module 165 may consist of a microprocessor to allow further qualifications based on the duration or repetition of arcing events, or to provide more sophisticated response to the presence of arcing. For more demanding applications, a microprocessor with an internal A-D converter could monitor the output of the integrator directly through an internal A-D channel input, and thereby implement software threshold and response algorithms.

Peak-integral gap detection provides high tolerance to cycle-to-cycle variations and exceptional detection performance even in the presence of high background interference. While the peak-integral gap detection method does not demand that the gaps be strictly synchronous with the line, it does require that narrow gaps occur substantially regularly, on the order of once per half-cycle. More specifically, while peak-integral detection does not detect arcing by monitoring the noise signal for gaps synchronized to the power waveform per se, in fact this circuit will only indicate arcing is present when gaps appear; if the duty cycle of high-frequency noise approaches 100%, the noise is due to a source other than arcing, e.g., a brush motor or the like. Stated differently, while peak-integral monitoring therefore constitutes monitoring the noise for patterns of variation of the amplitude that are substantially synchronous to the power waveform, peak-integral monitoring does not detect synchronicity per se. To adapt peak-integral methods to respond only to synchronous patterns, as may be required in more demanding applications, a synchronous averaging stage (as will be discussed in Section 2C below) can be added prior to peak-integral detection. In that case, the input to the peak-integral detector would include synchronous components only, such that arc detection would require synchronicity of gaps in the noise with the waveform.

C. Synchronous Averaging

As discussed previously, and particularly in relation to FIG. 5(a), the high-frequency noise produced by arcing exhibits short-term random fluctuations, usually exhibiting a number of dropouts from cycle to cycle. With threshold detection methods, these dropouts will appear as additional "false" gaps, making detection of synchronous gaps more difficult. However, as the dropouts are random in both position and width, they are not synchronous to the power waveform and therefore can be readily rejected by inserting a synchronous averaging stage prior to threshold detection. Furthermore, as discussed in relation to FIG. 8, from a frequency-domain perspective, synchronous averaging serves as a matched filter that passes only synchronous components in the waveform. Therefore, a synchronous averaging stage prior to a peak-integral detector will pass only those components that are strictly synchronous with the line frequency, thereby increasing the selectivity of this detection method. Alternatively, a synchronous averaging stage prior to a threshold-type detector will reduce cycle-to-cycle variations, making temporal threshold detection of gaps more reliable.

"Synchronous averaging" (as used herein) refers to the process of averaging a large number of sequential analog samples of the detected signal taken at equal intervals of one line period, with respect to corresponding samples taken at the same relative intervals of successive line periods. In this manner, only features that are present consistently from line cycle to line cycle will produce a significant effect on the corresponding portion of the averaged signal. Conversely, dropouts that occur sporadically in any one sample will have little effect.

Stated differently, synchronous averaging accentuates patterns of noise on the lines that are synchronous to the line frequency, regardless of their phase with respect to, for example, zero crossings of the current or voltage waveform, and provides a "clean" arc noise signal regardless of random cycle-to-cycle dropouts and variations in the gap duration. Accordingly, if arc-induced noise is present, the underlying waveform therein will be effectively amplified, while background noise from radio pickup and the like, not synchronized to the power waveform, will be attenuated, and dropouts and randomness in any particular cycle will be averaged out. The effect is to increase the signal-to-noise ratio of the arc-induced noise waveform with respect to noise from other sources.

The advantages of synchronous averaging are graphically illustrated in FIG. 12(c), where the synchronously averaged signal is shown in various stages of development, that is, over increasing numbers of line cycles. Trace 138 is typical of the averaged background signal as detected when there is no arcing, while traces 134, 135, and 136 show successive synchronously averaged signals (i.e., the signal averaged over progressively greater numbers of successive line cycles) after arcing has begun. With no arcing, even when specular background signals are present, the signal from the swept-frequency detector contains only asynchronous amplitude variations and therefore the output 138 remains at a low level. After arcing begins, arc noise is present throughout the line cycle, except at the three synchronous gaps 137, such that the synchronously averaged signal 134 begins to rise with respect to the background noise in the gaps 137. If arcing persists, the synchronously-averaged signal continues to rise other than during the gaps as shown at 135 until it reaches a stable level 136 wherein the gaps are clearly defined. Such a signal can be readily analyzed, e.g., by logic module 139 (FIG. 13) or 165 (FIG. 14), which may include hard-wired logic elements, a microprocessor, or combinations thereof.

As illustrated by comparison of the synchronously averaged output signal 136 and the typical input signal (e.g., FIG. 5(a)), the former is stable and does not show the dropouts and gap width fluctuations that occur in the latter. In particular, the gaps 137 in the synchronously-averaged signal 136 are the result of averaging the noise signal of FIG. 5 over many successive cycles, and thus can be more reliably detected. Synchronous averaging similarly improves the signal-to-noise ratio of other synchronous patterns of variation in the amplitude of the noise, such as the 'saddle' or 'bow-tie' patterns discussed in connection with FIGS. 2(d) and 3(d). By testing the synchronous average, instead of the RF envelope itself, for the presence of synchronous gaps or other patterns of variation in the amplitude of the noise, detection of arc patterns can be made responsive to the average pattern present and tolerant of sporadic, cycle-to-cycle variations. Furthermore, the amplitude of the synchronous average is proportional to the persistence of the arc and therefore to the energy dissipated by, and the relative fire danger posed by, the arc. Moreover, as discussed above, synchronous averaging coupled with temporal pattern detection effectively matches the spectral characterization of the arc-induced noise.

The rate at which the synchronously averaged waveform rises depends on the number of line cycles over which each sample is averaged, that is, the averaging time constant t. The resolution of the output signal 136 depends on the time duration of each sample, which should be short relative to the typical gap width. An averaging time constant on the order of one second and a sample width of 32 microseconds (512 samples/line cycle) has been found to work well for residential applications.

As discussed, the synchronously averaged signal is the set of the averages of N sequential samples over each line cycle. It is advantageous to take this set over the full line cycle instead of over the half-cycle period, because the arc pattern may be asymmetrical due to rectification effects. It is not necessary to align the phase of the sample set with the line, only to insure that the time between sequential sample sets is the same as the line period. To implement synchronous averaging, the system must be capable of storing at least N average values, as may be implemented using either analog or digital storage.

One convenient means of taking the synchronous average is to use a microprocessor with integral A-D conversion capability, take N sequential analog samples $x_k$ per line cycle and calculate the exponential running average $Y_k$ of successive samples in accordance with the equation shown below. The average $Y_k$ for the k-th time slot is:

$$y_k = e^{-\frac{dt}{\tau}} y_{k-1} + (1 - e^{-\frac{dt}{\tau}}) x_k$$

where:

k=number of current time slot $Y_k$=current average value for noise in time slot k $Y_{k-1}$=prior average value of noise in time slot k $x_k$=current input sample amplitude τ=time constant (seconds)

dt=time between corresponding samples, that is, length of the line cycle (seconds)

For residential arc detection, N may be set to 512 and the time constant τ between 0.016 and 1 second, depending on the persistence of arcing to be required before tripping. With 512 samples per line period (1/60 Hz=16.67 ms) each sample would be 16.67 ms/512=32.6 microseconds long. It will be appreciated that according to this equation, each successive sample "pulls" the value in its synchronous time slot up or down, thereby producing a sampled output waveform wherein each sample represents the average for that time slot over many line cycles.

As indicated above, if a microprocessor is provided for analysis of temporal patterns in the noise, the microprocessor may also perform synchronous averaging. Another method for implementing synchronous averaging makes use of a serial analog memory, e.g., a so-called "bucket brigade device" (BBD) to store the N averages, in combination with a weighted summer to calculate each average in turn. In this embodiment, the serial analog memory may be any charge-coupled analog shift register device configured to store each new value in turn, and output the stored values in sequence, without DC offset in order to allow direct feedback to implement recursive algorithms. To implement synchronous averaging, the detected signal output from the front end is sampled, weighted, and summed with the weighted sample from the previous line cycle (e.g., the output of the BBD) in accordance with the above equation. Since dt and $\tau$ are fixed, the weights are constant and therefore can be implemented with a simple analog summer. For example, with the time constant $\tau$ selected to be 0.25 seconds, and dt equal to the time between like samples, i.e., 16.67 ms, $e^{-dt/\tau}$ equals 0.935 and $(1-e^{-dt/\tau})$ equals 0.065. Therefore, each new input to the BBD becomes the sum of 0.935 times the previous average sample (then present at the output of a typical BBD circuit) plus 0.065 times the new value. The averaged values are thus automatically scaled with respect to a scale from zero to one; such scaling is desirable in each embodiment of synchronous averaging. An advantage of this approach is that synchronous averaging can thus be implemented without a microprocessor and may therefore lend itself to low-cost applications wherein the entire detector is integrated into one or two custom integrated circuits. Such an implementation is to be considered within the scope of the invention.

Analysis of the synchronously averaged waveform to detect arcing when present can then be carried out as discussed above and in detail in the parent patent and predecessor applications, that is, by examining the waveform for the presence of patterns of variation in the amplitude of the noise, e.g., gaps, or the bowtie or saddle patterns.

3. Arcing Fault Interrupter

Figure 16:
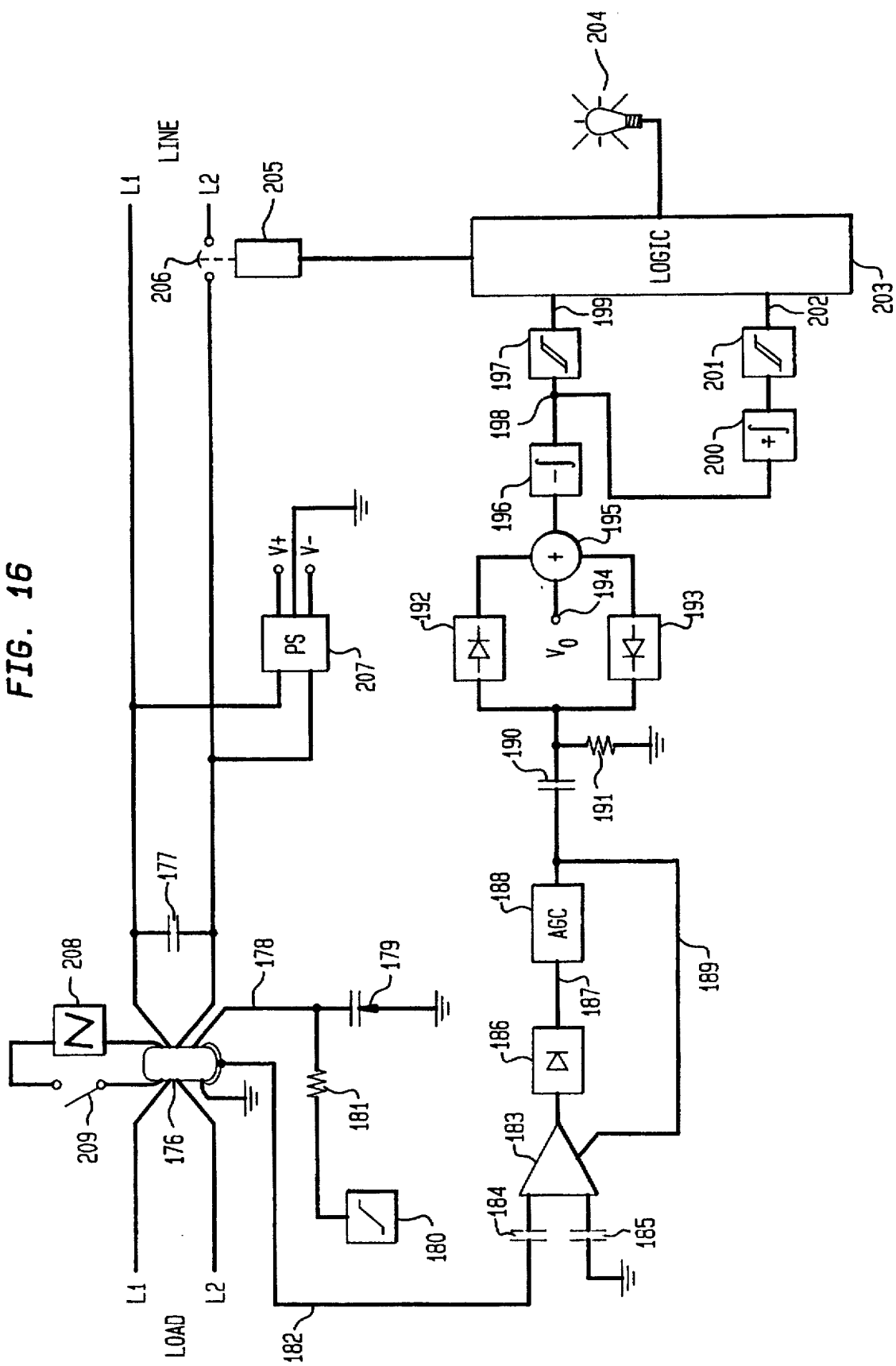
FIG. 16 shows a block diagram of circuitry implementing the present invention in one particularly preferred embodiment.
Figure 17A:
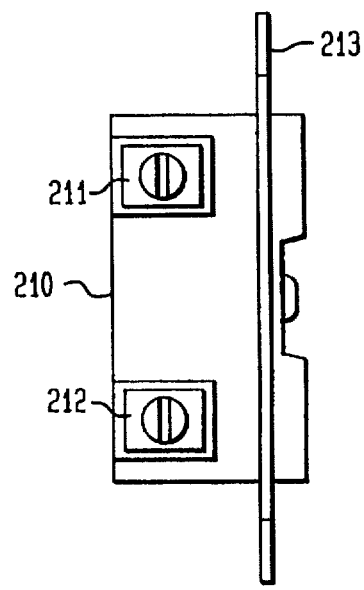
FIGS. 17(a) and (b) are side and front elevational views respectively of one physical package for an arcing monitor as described in connection with FIG. 16.
Figure 17B:
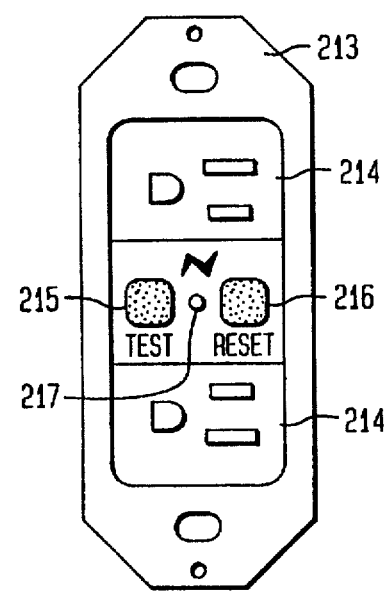

One preferred embodiment of the present invention, wherein the arc detector is configured as an outlet with built-in circuit interruption capability, is shown in detail by FIG. 16, showing the circuit, and FIGS. 17(a) and (b), showing one possible packaging approach. In this embodiment, a microprocessor is not required. The entire arc detection capability is provided by a single, low-cost integrated circuit. Of the various options within the scope of the invention discussed above, in this embodiment, the line current is sensed; a variable-frequency detector is implemented using a resonant transducer; arc pattern detection is implemented using the peak-integral method discussed in Section 2B, above; and a self-test circuit is included for functionality verification.

Referring to FIG. 16, a differentially-fed current transducer 176 (which may be the transducer shown in FIG. 11(c)) senses differential-mode signals due to arcing while attenuating common-mode signals, as may be introduced by coupling from parallel cable runs or radio signal reception. An optional shunt capacitor 177 upstream serves to provide a low-impedance path for the high-frequency arc signals, to maximize the current through the transducer and shunt signals originating upstream. This capacitor 177 should be in the range of 0.001–0.05 microfarads and is preferably a feed-through type to minimize lead inductance.

The transducer 176 is conveniently wound on a powdered-iron toroidal core, such as a Micrometals T50-17 core, to prevent saturation due to 60 Hz load currents. The overall inductance of the secondary 178 should be about 1.4 microhenries, as may be obtained using 24 equally-spaced turns of 24 gauge film-insulated magnet wire. This secondary inductance 178 resonates with a Motorola MVAM108 tuning diode 179 to produce a sweep range of about 5–30 MHz. A conventional sweep generator 180 produces a sawtooth waveform with a period of 11 milliseconds and a voltage sweep of 0.5–11 volts to sweep the resonant frequency. Isolation resistor 181 is about 220 k$\Omega$ and serves to isolate the sweep generator 180 from the resonant tank. The output of the transducer 176 is taken from a tap 182 at 7 turns from ground and feeds an RF amplifier 183 through blocking capacitors 184 and 185. A Motorola MC1350 variable gain differential amplifier may be employed as RF amplifier 183, providing up to 60 db gain. Detection is performed by a conventional AM detector 186. The detected RF signal at point 187 feeds a conventional AGC circuit 188 which controls the gain of amplifier 183 to maintain the average signal amplitude constant at output 187. As discussed previously, the AGC time constant is made fast, on the order of 50 µs or less, so as to produce an approximately logarithmic AGC output signal at 189, which is thus the logarithm of the detected signal.

The log detected signal 189 is then AC coupled through a capacitor 190 and referenced to ground through resistor 191. Capacitor 190 and resistor 191, with a time constant of about 0.1 second, serve to force the average value of the detected RF envelope to ground. To implement the peak-integral method of arc detection according to the invention, a conventional positive peak detector 192 and a conventional negative peak detector 193 monitor the peak signal excursions relative to ground. These peak detectors should be designed to have a fast attack time (<10 µs) and slow decay time (~22 ms) to track the RF envelope as shown in FIGS. 15(c) and 15(d). The outputs of the two peak detectors are then summed in summer 195, and the sum is fed to an inverting integrator 196. The integrator time constant should be about 10 ms for each of the two peak detectors. In this manner, when the negative peaks are strong, as when an arcing waveform is present, the integrator 196 will ramp up; when the positive peaks are strong, the integrator 196 will ramp down. A third input 194 from a positive $V_0$ (about 1/10th the maximum positive peak detector output) to the summer 195 presents a small bias to the integrator 196 to insure its output stays low with little or no signal input.

If the integrator output 198 rises above a predetermined threshold, threshold detector 197 will produce a logical change of state on output 199, which through the logic module 203 turns on an arc indicator 204. A second integrator 200, with a time constant on the order of 1 second, serves to determine whether the arcing persists long enough to present a hazard. When the output of integrator 200 exceeds the threshold set by a second threshold detector 201, the logic module 203 activates a trip solenoid 205 which interrupts current to both the load and the detection circuitry. A manual reset button 206 is provided to reset the trip mechanism and detection circuits.

Logic module 203 may be a simple gate or discrete logic arrangement that provides the necessary functionality. Alternatively, logic module 203 may consist of a low-cost microprocessor to allow further qualifications based on the duration or repetition of arcing events, or to provide a more sophisticated reaction to the presence of arcing. Another alternative is to utilize a microprocessor with internal A-D conversion capability to implement some or all of the analog circuit functions just described in software.

A power supply 207 converts the line voltage to low voltage DC to operate the detection circuits. The power supply shown has bipolar outputs to be consistent with the ground-reference explanation of the analog signal processing stages. It is more economical, however, to implement a single supply and use a virtual ground for signal paths.

It is advantageous to provide a self-test capability by which the device can be tested by the user to be assured that it is functioning. In the FIG. 16 embodiment, self-testing is accomplished by feeding a simulated arc signal, produced by arc synthesizer 208, through an additional winding in the current transducer, upon user actuation of a test switch 209. In this manner, the transducer, the detection circuitry, and the physical tripping mechanism are all tested. The arc synthesizer 208 is discussed below in Section 5.

FIGS. 17(a) and (b) show side and front views, respectively, of one suitable packaging approach for housing the arcing fault interrupter circuit of FIG. 16 in a dual-outlet enclosure similar to commonly available ground fault interrupters. A molded plastic case 210 houses the entire assembly. Screw terminals 211 and 212, together with two similar terminals on the other side and a ground terminal (not shown), provide connection to the line, load, and ground conductors. A metal bezel 213 fits around the case 210, so that the device can be mounted in conventional outlet boxes. Two outlets 214 provide the load connections. A test switch 215 (corresponding to switch 209 of FIG. 16) introduces a simulated arc signal to test the unit. If functioning, the unit will trip and must be manually reset using the reset switch 216 (corresponding to switch 206 of FIG. 16). An LED 217 indicates that contact arcing is presently occurring.

The circuit of FIG. 16, and modifications thereof, may be housed in a variety of other enclosures, including, for example, a conventional circuit breaker enclosure, or the type of modular housing used for DC power supplies supported on integral plug-in contact prongs. Alternatively, the circuit may be installed directly within equipment that needs arc protection.

4. Whole House Monitor

A second preferred embodiment of the present invention is an arc detector configured to monitor an entire household and to warn the user of the presence of incipient arcing within the house. In this embodiment, the line voltage is sensed at or near the load center; a heterodyning arc detector is implemented using available radio components; sweep voltage generation, A-D conversion, synchronous averaging, and gap measurements are provided by a microprocessor; and any of the techniques discussed by the parent patent and co-pending applications for analysis of the noise signal for the presence of synchronous variations of amplitude indicative of arcing may be employed.

Figure 18:
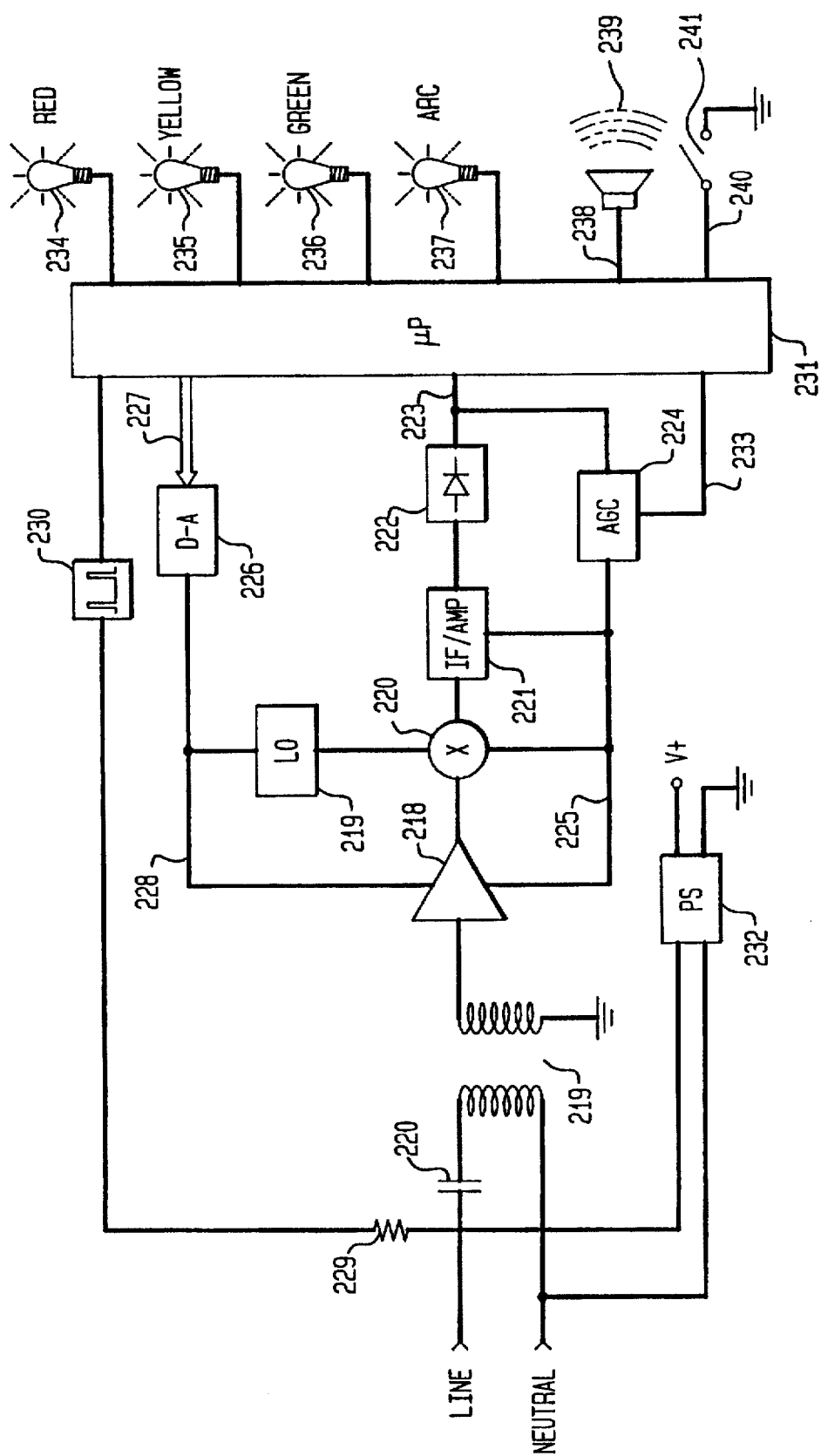
FIG. 18 shows a block diagram of circuitry implementing the present invention in another preferred embodiment.

Referring now to FIG. 18, the line voltage is coupled to a tuned RF amplifier 218 through an RF coupling transformer 219 and isolation capacitor 220. In this embodiment, the frequency range is 10–50 Mhz and the input is impedance-matched to the load center in order to monitor high-frequency voltage signals riding on the lines feeding the load center. Standard Romex-type wiring as typically used in residences acts as a transmission line at high frequencies, and if properly terminated, appears as a broadband resistive load. In a typical residence, however, the terminations and line lengths of the various circuits are unknown and highly variable, leading to unpredictable destructive and constructive interference as the frequency is varied. Consequently, the high-frequency impedance at any point along a single distribution circuit is unpredictable and difficult to match, i.e., in order to obtain good signal transfer. This limits the effectiveness of voltage sensing detectors for residential use.

The load center, however, as the center of a star configuration of perhaps 20–30 transmission lines, exhibits a low impedance, on the order of 10–30 Ω, across the measurement band. While selective portions of any high-frequency signal arriving at the load center on one transmission line may be reflected back, the remaining signal will be absorbed by all the other lines feeding the star center in accordance with the impedance characteristics of each line. Since a great number of effectively arbitrary resonances occur at once, substantial power will be transferred through the load center, enabling sufficient reception at the load center to effectively monitor the entire residence over a broad frequency range. Accordingly, for maximum signal transfer, the amplifier 218, coupling transformer 219 and isolation capacitor 220 are configured to present an input impedance of about 10–30Ω across the detection range of 10–50 Mhz.

The output of the tuned RF amplifier 218 is mixed with a local oscillator signal from source 219 in mixer 220 to produce a nominal IF frequency of 455 khz. The output of mixer 220 is amplified by a standard tuned IF amplifier 221 and then fed to a simple AM detector 222, to produce the envelope of the RF input at point 223. An AGC stage 224 controls the gain of the RF amplifier 218, the mixer 220, and the IF amplifier 221 through control line 225 in a conventional manner to avoid clipping and to optimize the signal-to-noise ratio.

A digital-to-analog (D-A) converter 226, controlled by the microprocessor through control lines 227, generates a control signal on line 228 used to tune both the input RF amplifier 218 and the local oscillator 219. Both use a hyper-abrupt varactor diode, such as the Motorola MVAM108, to effect voltage-controlled tuning in conventional fashion.

A high value resistor 229, on the order of 5–10 MΩ, isolates a conventional zero-crossing detector 230 from the line while feeding a small amount of the 60 Hz current to detector 230, which accordingly provides synchronization pulses to microprocessor 231. A power supply 232 is fed directly from the line, and supplies low voltage DC to the detection circuits.

Microprocessor 231 comprises two high-speed analog inputs, shown at 223 and 232, and a number of binary inputs and outputs. A large variety of single-chip microprocessors can be used, with or without additional support hardware, to readily meet these requirements, including Microchip's PIC16C74 series and Motorola's 68HC05 series of single chip processors. Display and control functions include a red status indicator 234, a yellow status indicator 235, a green status indicator 236, an arcing indicator 237, and an audible annunciator 239 driven by line 238, and a switch 241 for user input, connected to microprocessor 231 by line 240.

In a particularly preferred embodiment, the microprocessor 231 performs a calibration step at periodic intervals. In this step individual frequency sub-bands or channels are identified in which specular signals, such as broadcast radio signals, are present. In subsequent arc-monitoring operations, the identified sub-bands are skipped over.

This "frequency deletion" step may be implemented by programming the microprocessor to tune the receiver comprised by local oscillator 217 feeding mixer 220 in succession to each of a large number of different frequencies across the detection range, that is, to the centers of the sub-bands into which the overall frequency range is divided. The microprocessor 231 does this by incrementing the control signal to D-A converter 226, which accordingly increases the control voltage to local oscillator 219. If an 8-bit D-A converter 226 is used, the amplitude of signals detected in each of 256 sub-bands may thus be measured in succession. The entire frequency band is thus examined several times, e.g., over several successive line cycles, in each calibration step. Where substantial background signals in the same sub-bands are detected in each examination, this indicates the presence of specular, narrow-band signals, such as broadcast radio signals or the like, and the microprocessor records those channels. In subsequent arc-monitoring operations, the microprocessor thus controls D-A converter 226 to construct an otherwise linear sweep pattern excluding the identified frequency sub-bands. In this "frequency deletion" process stable sources of background noise are substantially omitted, increasing the detection sensitivity for arcing.

It will be appreciated, of course, that such specular sources will normally not exhibit gaps synchronized to the power waveform; accordingly, specular signals would be doubly precluded from appearing as spurious arc-induced noise in a system performing both frequency-deletion and gap detection.

Once having identified those channels in which coherent background signals are present, as just described, the microprocessor 231 sweeps the detection frequency continuously through the remaining frequency channels while performing synchronous averaging (in this embodiment, in software) with respect to the linear detected signal present on input 223. Using the line sync pulses from zero-crossing detector 230 to synchronize its operation to the line, processor 231 first divides the line cycle into 512 equal time slots and configures a table of 512 values, each of which will contain an exponentially-weighted running average of the input signal on lines 223 during the corresponding time slot over successive line cycles. To accomplish this, software is designed to acquire each sample, weight it exponentially according to the equation given in Section 2C, and then sum the weighted new sample with the correspondingly weighted value in the table, that is, with the previously stored value. This sum is then stored as the updated value in the table. In this manner, the table will contain an exponentially-weighted, sampled, scaled representation of the RF envelope appearing at input 223.

As discussed, if the arc persists, the set of exponentially-weighted averages will gradually define a stable arc pattern which can be readily tested for the presence of gaps using temporal analysis described in this application and in the parent patent and predecessor applications. In general, the stored waveform is checked for the presence of two gaps per line cycle, each within a predetermined width range indicative of persistent arcing, i.e., extending between 0° and 90° of the line cycle. If such a pattern is detected, the microprocessor 231 determines that arcing exists and flashes the arcing indicator 237.

Under normal circumstances, microprocessor 231 illuminates the green status light 236, indicating that any noise meeting the conditions required to be met before arcing is considered to be detected is below the expected level of dangerous arcing, i.e., is due to normal operation of switches, lamp dimmers and the like. If the duration of any arcing event exceeds a predetermined time limit, say two line cycles, indicating that such arcing could prove hazardous, the microprocessor turns off the green light 236 and illuminates the yellow light 235. This light will remain illuminated until reset by the user by depressing the reset button 241. If the duration and frequency of arcing exceeds a second threshold level, say twenty line cycles, indicating that the arcing is demonstrably hazardous, the microprocessor turns off the yellow light 235 and turns on the red light 234, indicating that a serious hazard exists. When this happens, microprocessor 231 also periodically beeps the audible annunciator 239 to call attention to the load center and inform the residents of the hazard. Again, the detector must be manually reset by depressing the reset switch 241 to clear the alarm status and reset the green light 236.

It should be understood that there are many ways in which the software might be implemented to provide appropriate warnings for homeowners and that field experience will show which modes of operation and threshold limits are best. Additional control actions taken in response to arc detection—for example, automatically calling an electrician to investigate the arcing—are within the scope of the invention. When used for different applications, such as businesses or historic sites, the annunciation and operational needs may differ, thereby requiring a different response. All such variations are to be considered within the scope of the invention.

Figure 19A:
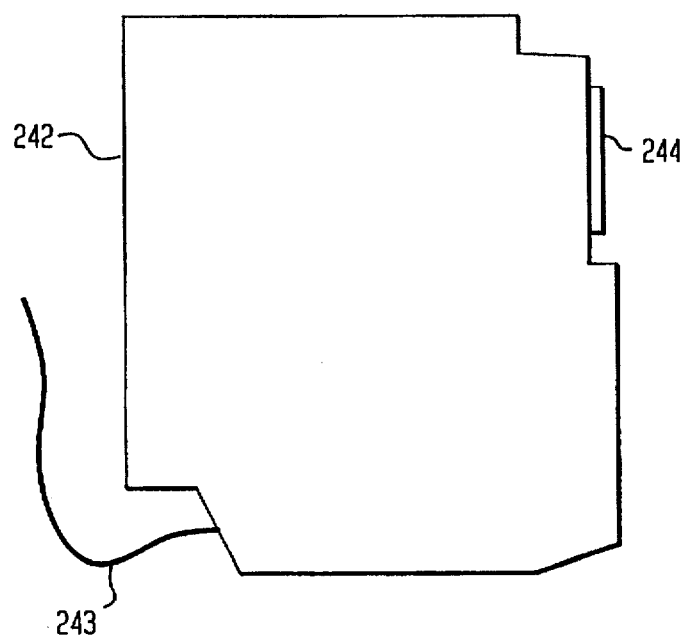
FIGS. 19(a) and (b) are side and front elevational views respectively of one physical package for an arcing monitor as described in connection with FIG. 18.
Figure 19B:
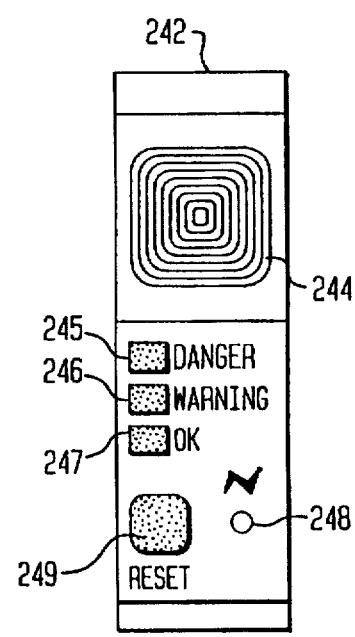

A suitable physical embodiment of the whole-house detector corresponding to the circuit of FIG. 18 is shown in FIGS. 19(a) and (b), showing side and front views, respectively, of a whole-house detector built into a conventional circuit breaker housing, in this case serving solely as a monitor and therefore not including the standard trip mechanism. The advantage of this packaging is that the detection circuits can be closely coupled to the load center buses, thereby easily achieving the low impedance match required for optimum detection sensitivity. The detector can be simply installed in an empty slot in the load center. Referring now to FIG. 19(a), a housing 242 contains a standard prong connector (not shown) to clip onto one of the phase busses. A separate wire 243 is provided for connection to neutral. As shown in FIG. 19(b), the front of the enclosure contains a grill 244 to permit the audible annunciator to sound loudly, three status indicator lights 245–247, an arc light 248 and a reset button 249.

Alternative useful packaging designs for the arc detection of the invention include a plastic, 'nite-lite' style plug-in enclosure that can be plugged into an outlet located close to the load center for providing a whole-house detector, or an insertion ring design to be interposed between a standard electric meter and its holder. The latter embodiment might comprise a transmitter to communicate circuit status information elsewhere, or a small display panel built directly into a specialized load center.

5. Arc Noise Synthesis for Self Testing

As discussed extensively, persistent arcing characteristically causes wideband noise containing one synchronous gap per half-cycle of the line. Accordingly, an effective way to test any of the described arc detectors is to feed an accurate simulation of arc noise to the detector and thereby determine whether the correct response is provided.

Arc noise results from avalanche multiplication of charges across a physical gap. Similar avalanche effects occur across potential barriers at reversed-biased semiconductor junctions, although at much lower current levels. Consequently, by implementing suitable current limiting means, the noise produced by avalanche multiplication in reverse-biased semiconductor junctions can be used to simulate the noise component of the characteristic arc pattern in a safe and inexpensive manner. The second characteristic feature of arc-induced noise, synchronous gaps in the noise, can be simulated by gating the noise with pulses derived from the line voltage. In this manner, an accurate facsimile of characteristic arc patterns can be synthesized as a means of testing arc-responsive devices according to the invention. One such arc noise synthesizer for self-testing is included in the circuit of FIG. 16 in block diagram form at 208.

FIG. 20 shows one possible schematic diagram of a simple arc waveform synthesizer. A semiconductor junction in a diode 250 is back-biased by a voltage V+, with current limiting resistor 251 serving to limit the current at breakdown to non-destructive levels. If the voltage V+ is made substantially higher than the reverse breakdown voltage of the junction 250, the junction will avalanche, producing wideband noise extending to 50 Mhz or higher, depending on the device selected. The noise present at 252 is then amplified through a wideband amplifier 253 gated in response to a control input on line 256. The line voltage (or current) 255 is fed to an appropriate zero-crossing detector 254 to produce synchronous pulses of the desired width twice per line cycle. These pulses gate the amplifier 253 on and off, to produce synchronous gaps and a simulated arc waveform on output line 257. With appropriate buffering, the simulated arc signal may then be fed as a voltage to voltage-sensing arc detectors, or as a current to current-sensing arc detectors.

It will be appreciated from the above discussion that the process of arc detection according to the invention amounts to a process of analyzing what is ordinarily considered noise in an electrical system. More particularly, arcing impresses on the power waveform noise which is of substantially continuous frequency and is of substantially continuous time duration apart from patterns of variation in its amplitude, e.g., the gaps, which occur in synchronicity to the zero-crossings of the power waveform. The unique characteristics of arcing in both the frequency and time domains are employed for highly reliable arc detection according to the invention, that is, to distinguish arc-induced noise from other sources of high frequency noise on a power line.

For example, the fact that arcing is wide-band can be used to distinguish the invention from specular sources such as broadcast radio signals and the like. In particular, the overall frequency range monitored for arc-induced noise can be divided into sub-bands. The energy level in each of the sub-bands is measured at calibration intervals, to determine the presence of specular interference; those bands wherein broadcast radio signals are present can be disregarded in subsequent analysis of the overall noise signal. Of course, other methods in the frequency domain of determining whether the noise being detected is due to arcing, such as examining the frequency contact of the noise for randomness, for the presence of components above a particular frequency, or for the 1/f or "pinkness" characteristic, are within the scope of the invention as disclosed herein and in the parent patent and predecessor applications.

With respect to analysis performed in the time domain according to the invention, arcing-induced noise is distinguished from other sorts of wide bandwidth high-frequency noise by requiring that the amplitude of the signal obey certain patterns determined by the inventor to be indicative of arcing. Again, in most embodiments, this involves the detection of gaps synchronous to the power waveform. This process can be further improved by synchronous averaging, wherein the line cycle is divided into a large number of time slots, and the amplitude of the noise in each time slot over a number of line cycles is summed. Exponential weighting of each sample of the amplitude is particularly advantageous. Performance of synchronous averaging allows the underlying pattern of variation in the amplitude of the noise synchronous to the power waveform to appear clearly, despite the fact that the gaps are somewhat random, obscuring this pattern in any individual line cycle. Synchronous averaging effectively increases the signal-to-noise ratio of the arcing-induced noise waveform with respect to the other noise on the power line.

Time domain analysis of high-frequency noise to detect arcing also includes the peak-integral methods disclosed above, where the duty cycle of the noise—that is, the percentage of the line cycle during which the noise exceed a threshold—is measured. If the duty cycle of wideband noise on the line approaches but does not reach 100%, dangerous arcing is likely present; if it reaches 100%, no gaps are present, such that the noise is due to some other source. Hence the requirement that the duty cycle not reach 100% in the peak-integral method is effectively a requirement that periodic gaps be detected.

Processing high-frequency noise on an AC power line according to both frequency and time domain techniques as just described thus provides a unique method of discriminating arcing-induced noise from other sorts of noise. The invention involves implementation of the inventor's realization that arcing induces high-frequency noise of certain specified characteristics in the time and frequency domains on the power waveform. The method of detecting arcing according to the invention consequently involves the steps of analyzing high-frequency noise on the powerline for conformity to both frequency and temporal characteristics unique to arc-induced noise; correspondingly, apparatus for detecting arcing according to the invention involves means for analyzing high-frequency energy on the power waveform for conformity to specified characteristics in both the time and frequency domains.

While several preferred embodiments of the invention have been disclosed in detail, various further improvements may be made by those of skill in the art. Therefore, the above disclosure should be considered exemplary only, and not as limiting of the invention; the invention is to be limited only by the following claims.

What is claimed is:

1. A method for detecting the presence of electrical arcing on an AC power line of frequency F and period T=1/F, comprising the following steps:

monitoring the line current, line voltage, or energy emitted from the line as a waveform;

supplying the monitored waveform to the input of a narrow bandpass variable-frequency filter having a minimum pass frequency substantially higher than F; and examining the signal passing through the filter as a function of time, to detect recurring features indicative of arcing.

2. The method of claim 1, comprising the further step of sweeping the pass band of said variable-frequency filter through a predetermined set of frequencies.

3. The method of claim 2, comprising the further step of determining that wide bandwidth noise possibly due to the presence of arcing on the power line is present if the signal passing through the filter indicates that the amplitude of high-frequency energy on the power waveform exceeds a predetermined minimum value substantially throughout the frequency band through which the filter is swept.

4. The method of claim 2, wherein the pass band of said variable-frequency filter is swept asynchronously to said power waveform.

5. The method of claim 1, wherein the recurring features indicative of arcing include patterns of variation in the amplitude of the signal passing through the filter.

6. The method of claim 5, wherein said patterns of variation in the amplitude of the signal passing through the filter comprise gaps appearing at intervals substantially equal to integral multiples of T/2 during which the amplitude of the signal is substantially less than at other times during the line cycle.

7. The method of claim 5, wherein the recurring features indicative of arcing are detected by measuring the duty cycle of the signal passing through the filter, by determining the percentage of the line cycle during which the amplitude of the signal exceeds a predetermined threshold, and determining that arcing exists when said duty cycle approaches, but does not reach, 100%.

8. The method of claim 7, wherein said duty cycle is measured by performance of the following steps:

AC coupling the signal to a reference DC level;

monitoring positive peak excursions of the signal above said reference level;

monitoring negative peak excursions of said signal below said reference level; and providing a value for said duty cycle responsive to the integral of the absolute value of said negative excursions minus the absolute value of said positive excursions.

9. The method of claim 8, wherein the peak excursions are measured with peak detectors selected to have fast attack and slow decay characteristics.

10. The method of claim 1, wherein said recurring features are detected after synchronous averaging, comprising the steps of:

dividing the line cycle into a plurality of portions of equal length;

sampling the amplitude of the signal passing through the filter during each portion of a number of successive line cycles;

summing the amplitudes of each portion of the signal passing through the filter together with the amplitudes of corresponding portions of the signal during previous line cycles; and scaling each sum to produce a synchronously averaged waveform.

11. The method of claim 1, wherein the steps of supplying the monitored waveform to the input of a narrow bandpass variable-frequency filter and examining the signal passing through the filter are performed by mixing the input waveform with a local oscillator signal swept through a predetermined range of frequencies.

12. The method of claim 1, wherein the steps of supplying the monitored waveform to the input of a narrow bandpass variable-frequency filter and examining the signal passing through the filter are performed by using a variable-frequency tuned transducer to detect high-frequency signals present on the power line, followed by signal amplification and detection.

13. The method of claim 1, further comprising a frequency selection step, wherein signals of frequencies within identified sub-bands of an overall range of frequencies passing through said variable-frequency filter are omitted prior to the step of examining the signal passing through the filter for the presence of recurring features indicative of arcing.

14. The method of claim 13, wherein said frequency selection step is performed by the following steps:

defining an overall range of frequencies through which the pass band of said variable-frequency filter is swept;

dividing said overall range of frequencies into a large number of sub-bands;

measuring the amplitude of energy on said waveform within each of said sub-bands during each of a plurality of successive line cycles;

identifying those sub-bands wherein energy above a threshold level is measured during each of said plurality of successive line cycles; and omitting the identified sub-bands from the overall range of frequencies with respect to which energy passing through said variable-frequency filter is examined for the presence of patterns indicative of arcing.

15. In an AC electrical network, wherein any electrical contact arcing in the network superimposes wide bandwidth high frequency noise on a power supply line, the amplitude of the superimposed noise exhibiting patterns of regular variation substantially synchronized to the AC line cycle, a method for synchronous averaging of the noise on the line for improved discrimination of the patterns exhibited by the noise, and for detecting such patterns, comprising the steps of:

dividing the line cycle into a plurality of portions of equal length;

sampling the amplitude of the noise during each portion of a number of successive line cycles;

summing and scaling the amplitudes of the noise sampled during corresponding portions of successive line cycles, thereby producing a synchronously averaged waveform; and examining the synchronously averaged waveform in order to locate patterns of regular variation in the amplitude of the waveform substantially synchronized to the line cycle.

16. The method of claim 15, comprising the further step of discriminating noise due to arcing from noise due to other sources by measuring the temporal width of portions of the synchronously averaged waveform during which the average amplitude is substantially less than during other portions thereof.

17. Apparatus for detecting the presence of electrical arcing on an AC power line, comprising:

means for monitoring one of the line voltage, line current, or energy emitted from the line and for extracting high-frequency noise therefrom;

means for synchronously averaging the extracted noise signal, comprising:

means for dividing the AC line cycle into a plurality of portions of equal length;

means for sampling the amplitude of the noise during each portion of a number of successive line cycles; and means for summing the amplitudes of the noise sampled during corresponding portions of successive line cycles, thereby producing a synchronously averaged noise signal; and means for examining the synchronously averaged noise signal to detect arcing on the power line, comprising:

means for comparing portions of the synchronously averaged noise signal to one another, in order to locate patterns of regular variation in the amplitude of the noise substantially synchronized to the AC line cycle.

41

18. The apparatus of claim 17, wherein said means for extracting high-frequency noise from the AC power waveform comprises a narrow bandpass swept-frequency filter.

19. The apparatus of claim 18, further comprising:
means for evaluating the amplitude of the signal passing through the filter as a function of frequency and for determining that wide bandwidth noise possibly due to the presence of arcing on the power line is present responsive to the evaluation.

20. The apparatus of claim 19, wherein arcing is determined possibly to be present if the amplitude of the signal passing through the filter exceeds a predetermined minimum value substantially throughout the frequency range through which the filter is swept.

21. The apparatus of claim 18, further comprising:
means for identifying frequency sub-bands throughout the frequency range through which the filter is swept;
means for measuring the amplitude of energy in each of said sub-bands during a plurality of successive line cycles;
means for identifying sub-bands wherein energy exceeding a predetermined minimum value is present during each of said successive line cycles; and
means for omitting energy in said identified sub-bands from the noise extracted from the waveform by said filter.

22. Apparatus for detecting electrical contact arcing in an electrical network having at least one AC power supply line, such that any arcing in the network superimposes wide bandwidth high frequency noise on the AC power waveform, the amplitude of the superimposed noise exhibiting patterns of regular variation substantially synchronized to the AC power waveform, comprising:
frequency-domain analysis means, for examining high-frequency noise on the power waveform as a function of frequency;
time-domain analysis means for examining a signal proportional to the amplitude of the high-frequency noise on the power waveform as a function of time; and
means for providing a signal that arcing is present, if:
(1) said frequency-domain analysis means determines that high-frequency noise on the power waveform exhibits frequency components conforming to predetermined characteristics of arcing-induced noise; and
(2) said time-domain analysis means determines that said signal proportional to the amplitude of the high-frequency noise on the power waveform exhibits predetermined patterns of variation in amplitude conforming to predetermined characteristics of arcing-induced noise.

23. The apparatus of claim 22, wherein said time-domain analysis means determines that said signal proportional to the amplitude of the noise exhibits predetermined patterns of variation in amplitude synchronized to the power waveform.

24. The apparatus of claim 23, wherein the predetermined patterns of variation in the amplitude of the noise comprise gaps during which the amplitude of the noise is substantially less than at other times during the line cycle.

25. The apparatus of claim 22, wherein said time-domain analysis means comprises a microprocessor provided with a signal proportional to the amplitude of the noise, the microprocessor being adapted to examine the signal as a function of time and to determine that arcing is present if the signal exhibits repetitive patterns of variation in amplitude synchronized to the power waveform.

42

26. The apparatus of claim 25, wherein said signal proportional to the amplitude of the noise provided to the microprocessor is an analog signal, the microprocessor comprising internal analog-to-digital conversion circuitry.

27. The apparatus of claim 26, wherein said analog signal proportional to the amplitude of the noise provided to the microprocessor is approximately the logarithm of the amplitude of the noise.

28. The apparatus of claim 27, wherein said logarithm of the amplitude of the noise is derived from an automatic gain control circuit element responsive to the noise.

29. The apparatus of claim 22, wherein said frequency-domain analysis means comprises means for determining that high-frequency noise possibly due to arcing is present if the noise satisfies one or more of tests for wide bandwidth, randomness, amplitude inversely proportional to frequency, or presence of frequency components above a predetermined threshold value.

30. The apparatus of claim 29, wherein high-frequency noise on said waveform is separated therefrom by a narrow bandpass, swept-frequency filter, and wherein said frequency-domain analysis means analyzes the output of said filter, and further comprises:
means for identifying frequency sub-bands throughout the frequency range through which the filter is swept;
means for measuring the amplitude of energy in each of said sub-bands during a plurality of successive line cycles;
means for identifying sub-bands wherein energy exceeding a predetermined minimum value is present during each of said successive sub-bands; and
means for excluding energy in said identified sub-bands from the noise subsequently extracted from the waveform by said filter.

31. The apparatus of claim 22, further comprising means for computing a synchronously averaged noise signal over a plurality of line cycles prior to examination by said time domain analysis means.

32. The apparatus of claim 31, wherein the means for computing a synchronously averaged noise signal over a plurality of line cycles comprises:
means for dividing the line cycle into a plurality of portions of equal length;
means for sampling the amplitude of the noise during each portion of a number of successive line cycles; and
means for summing and scaling the amplitudes of the noise sampled during corresponding portions over a number of successive line cycles, thereby producing a synchronously averaged noise signal.

33. The apparatus of claim 22, wherein said time-domain analysis means for determining that said signal proportional to the amplitude of the noise exhibits predetermined patterns of variation in amplitude comprises means for measuring the duty cycle during which the frequency components conform to predetermined characteristics of arcing-induced noise, and determining that arcing exists when said duty cycle approaches, but does not reach, 100%.

34. Apparatus for detecting contact arcing in an electrical network having AC power supply lines, such that arcing in the network superimposes wide bandwidth high frequency noise on the power supply lines, the amplitude of the superimposed noise exhibiting patterns of regular variation substantially synchronized to the AC power waveform, comprising:
a swept-frequency bandpass filter, for filtering high frequency noise from the power lines, and for discriminating wide bandwidth noise on the power lines from impulse and specular noise; and means for examining an output signal from the swept-frequency bandpass filter to determine whether said output signal exhibits patterns characteristic of arcing on the power lines.

35. The apparatus of claim 34, wherein the means for examining the output signal from the swept-frequency bandpass filter comprises means for detecting repetitive patterns of variation in the amplitude of the output signal substantially synchronized to the power waveform.

36. The apparatus of claim 35, wherein the repetitive patterns of variation in the amplitude of the noise comprise gaps during which the amplitude of the noise is substantially less than at other times during the line cycle of the power waveform.

37. The apparatus of claim 35, wherein said means for detecting repetitive patterns of variation in the amplitude of the output signal substantially synchronized to the power waveform comprises means for measuring the duty cycle of frequency components conforming to predetermined characteristics of arcing-induced noise and determining that arcing exists when said duty cycle approaches, but does not reach, 100%.

38. The apparatus of claim 34, wherein the means for examining the output signal from the swept-frequency bandpass filter comprises threshold detector means for comparing the amplitude of the output signal to a predetermined level, and for providing a binary output signal responsive thereto.

39. The apparatus of claim 38, wherein the threshold detector means compares the amplitude of the noise to a predetermined level varying dynamically in response to the minimum level of noise detected during the line cycle.

40. The apparatus of claim 39, wherein the noise signal is logarithmically amplified prior to threshold comparison.

41. The apparatus of claim 34, further comprising means for generating a test signal exhibiting frequency and temporal characteristics comparable to arcing-induced noise on the power supply lines, for verifying operation of said apparatus.

42. The apparatus of claim 41, wherein said means for generating a test signal comprises a back-biased semiconductor junction for being stimulated into avalanche conduction responsive to a signal synchronous to the power waveform.

43. The apparatus of claim 34, further comprising means for computing a synchronous average of the output signal from the swept-frequency bandpass filter over a plurality of line cycles.

44. A method for detecting the presence of arcing in an AC power distribution system, such that such arcing impresses high-frequency noise exhibiting predetermined variation with time on the power waveform, comprising the steps of:

performing a frequency-domain test, to determine whether the frequency of noise on said power waveform conforms to predetermined criteria indicative of arcing;

performing a time-domain test, to determine whether the amplitude of noise on said power waveform varies in conformity with predetermined patterns indicative of arcing; and determining that arcing has been detected only when both said frequency-domain and said time-domain tests have been satisfied.

45. The method of claim 44, wherein said frequency-domain test comprises filtering said AC power waveform using a variable-frequency filter having a minimum pass frequency substantially higher than the fundamental frequency of said AC power waveform, such that high-frequency energy of wide bandwidth passes through said filter, while specular energy on the power waveform is filtered therefrom.

46. The method of claim 45, wherein said frequency-domain step comprises the following further steps:

identifying the frequencies of specular signals within the overall passband of said variable-frequency filter; and deleting energy of frequencies corresponding to the frequencies of said identified specular signals prior to determining whether the frequency of noise on said power waveform conforms to predetermined criteria indicative of arcing.

47. The method of claim 45, wherein said time-domain test is performed on a noise signal having been filtered by said variable-frequency filter.

48. The method of claim 47, wherein said time-domain test comprises examining said noise signal having been filtered by said variable-frequency filter for the existence of patterns in the amplitude thereof synchronized to said AC power waveform.

49. The method of claim 48, wherein said patterns comprise gaps of substantially reduced amplitude in said noise signal with respect to the remainder of the noise signal.

50. The method of claim 49, wherein said time-domain step comprises measuring the proportion of the power waveform during which the amplitude of said noise signal exceeds a threshold value, and examining the noise signal to determine whether its amplitude varies substantially regularly over time.

51. The method of claim 44, comprising the further step of computing a synchronously averaged noise signal with respect to which said time-domain test is performed.

* * * * *